(12) United States Patent
Long et al.

(10) Patent No.: US 9,594,111 B2
(45) Date of Patent: Mar. 14, 2017

(54) TURRET HANDLERS AND METHODS OF OPERATIONS THEREOF

(71) Applicant: Infineon Technologies AG, Neubiberg (DE)

(72) Inventors: Theng Chao Long, Melaka (MY); Nee Wan Khoo, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 248 days.

(21) Appl. No.: 13/779,544

(22) Filed: Feb. 27, 2013

(65) Prior Publication Data

US 2014/0239998 A1  Aug. 28, 2014

(51) Int. Cl.
  *G01R 31/26* (2014.01)
  *G01R 31/02* (2006.01)
  *G01R 31/28* (2006.01)

(52) U.S. Cl.
  CPC ......... *G01R 31/2601* (2013.01); *G01R 31/26* (2013.01); *G01R 31/28* (2013.01); *G01R 31/2893* (2013.01)

(58) Field of Classification Search
  CPC ............ G01R 31/2893; G01R 31/2601; G01R 31/2865; G01R 31/2881; G01R 31/01; G01R 31/046; G01R 31/2887; G01R 31/2891; G01R 31/2896; G01R 1/06705; G01R 31/26; G01R 31/2867; G01R 31/2851; G01R 31/2808; G01R 1/0433; G01R 1/07342; G01R 31/2831; G01R 31/2886; G01R 1/0408; G01R 31/318505; G01R 31/31903; H04W 24/00; H04W 24/06; Y10T 436/111666; Y10T 436/2575

USPC ........... 324/762.01, 756.03, 750.03, 756.02, 324/757.01
See application file for complete search history.

(56) References Cited

U.S. PATENT DOCUMENTS 8,297,433 B2 * 10/2012 Thiel et al. ................ 198/471.1
2007/0080700 A1 * 4/2007 Kolman ............ G01R 31/2893
324/756.01

(Continued)

FOREIGN PATENT DOCUMENTS

CN          1297298 A     5/2001
CN        101493495 A     7/2009

(Continued)

*Primary Examiner* — Alesa Allgood
(74) *Attorney, Agent, or Firm* — Slater Matsil, LLP

(57) ABSTRACT

In one embodiment, a method of testing a semiconductor component includes loading a plurality of semiconductor components into a main turret of a turret handler, transporting the plurality of semiconductor components using the main turret to a test area, and splitting the plurality of semiconductor components into a first set and a second set. The method further includes testing a first semiconductor component in the first set at a first test pad using a tester while transporting a second semiconductor component in the second set to a second test pad and testing the second semiconductor component using the tester while transporting the first semiconductor component out of the first test pad. The first set and the second set are merged into the plurality of semiconductor components and the plurality of semiconductor components are transported away from the test area using the main turret.

14 Claims, 64 Drawing Sheets

(56) References Cited

U.S. PATENT DOCUMENTS

| | | | |
|---|---|---|---|
| 2007/0080703 A1* | 4/2007 | Ding | G01N 21/95684 |
| | | | 324/750.07 |
| 2007/0212201 A1 | 9/2007 | Langer et al. | |
| 2010/0097075 A1 | 4/2010 | Sze et al. | |
| 2010/0310343 A1* | 12/2010 | Mayer | G01D 18/00 |
| | | | 414/222.07 |

FOREIGN PATENT DOCUMENTS

| | | | |
|---|---|---|---|
| CN | 101769974 A | 7/2010 | |
| JP | 1320483 A | 12/1989 | |
| JP | 568962 U | 9/1993 | |
| JP | 9159724 A | 6/1997 | |
| JP | 09159724 A | 6/1997 | |
| JP | H09159724 * | 6/1997 | G01R 31/26 |
| JP | 1019972 A | 1/1998 | |
| JP | 11281695 A | 10/1999 | |
| JP | 2004354244 A | 12/2004 | |
| JP | 2012117915 A | 6/2012 | |
| WO | WO 2010/009868 A1 | 1/2010 | |

\* cited by examiner

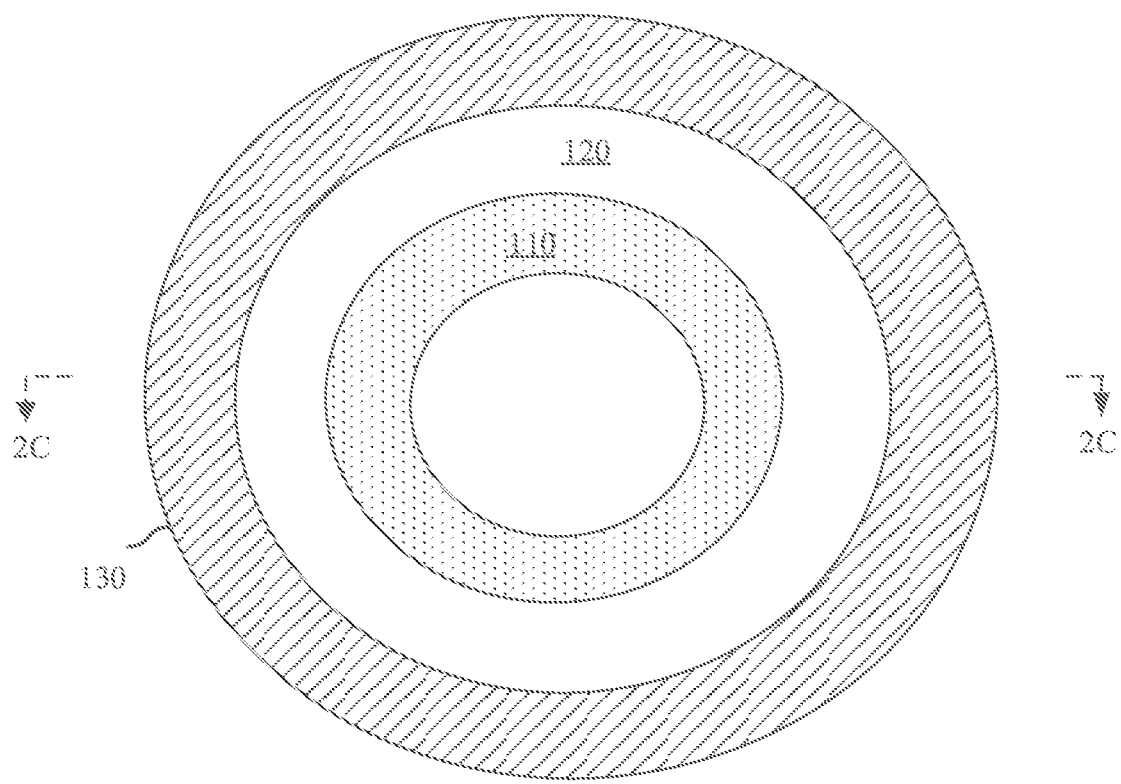
Fig. 2B
 
Fig. 2C

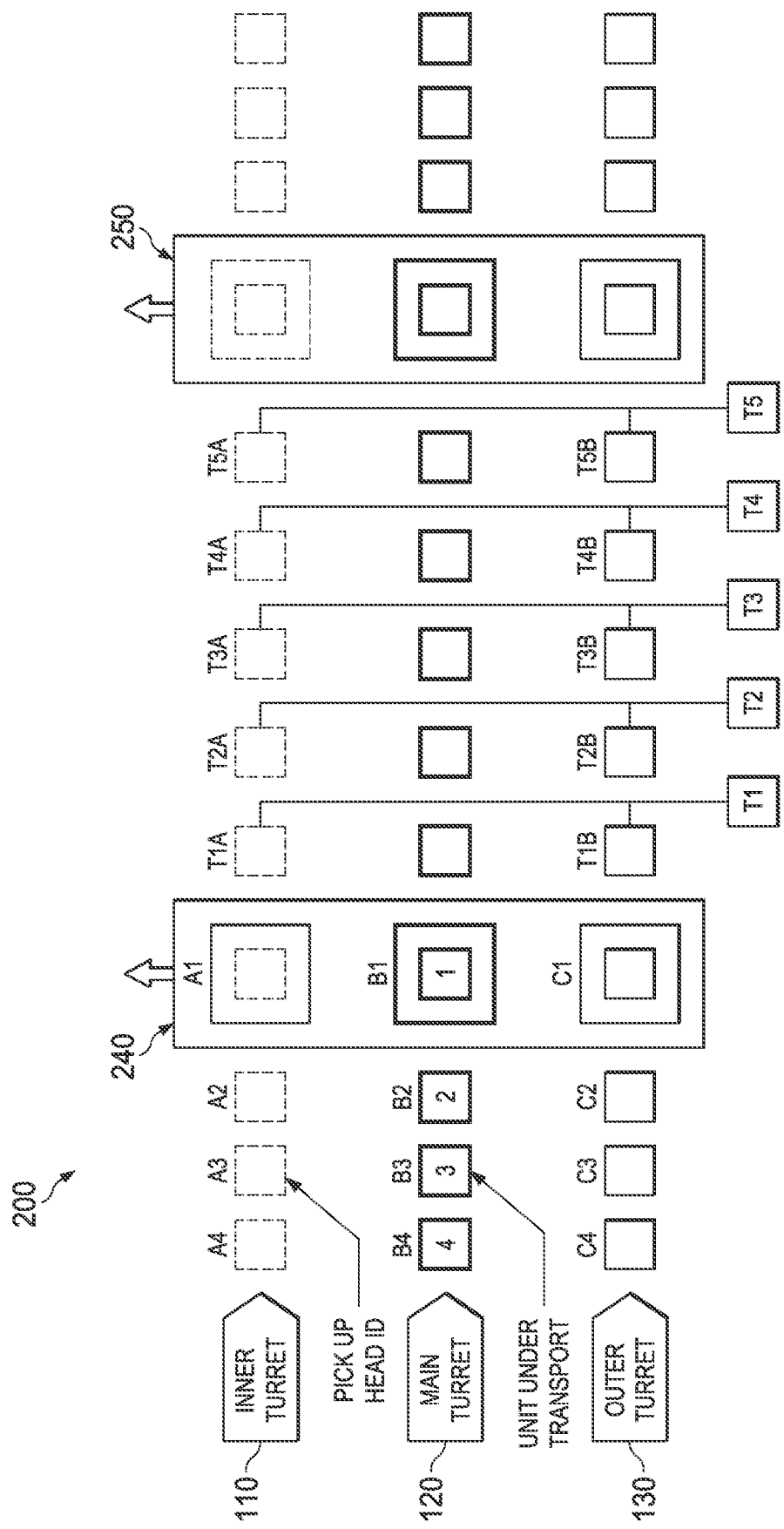

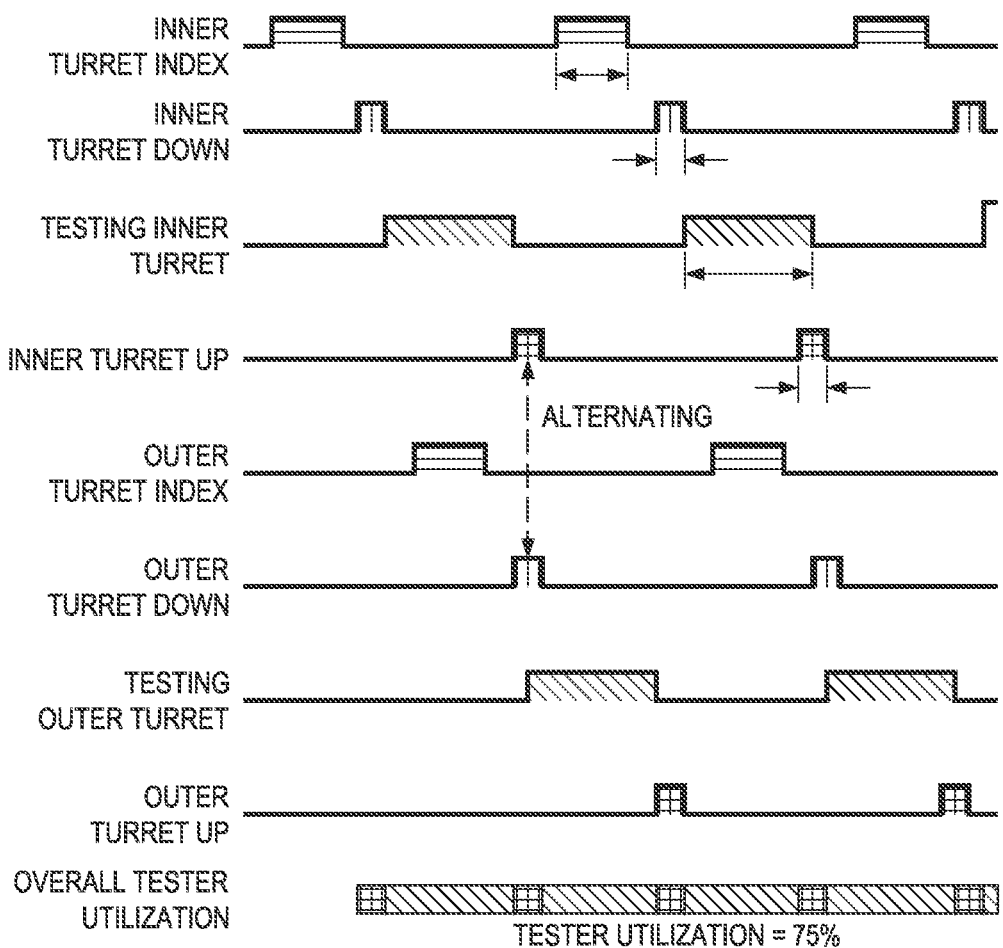

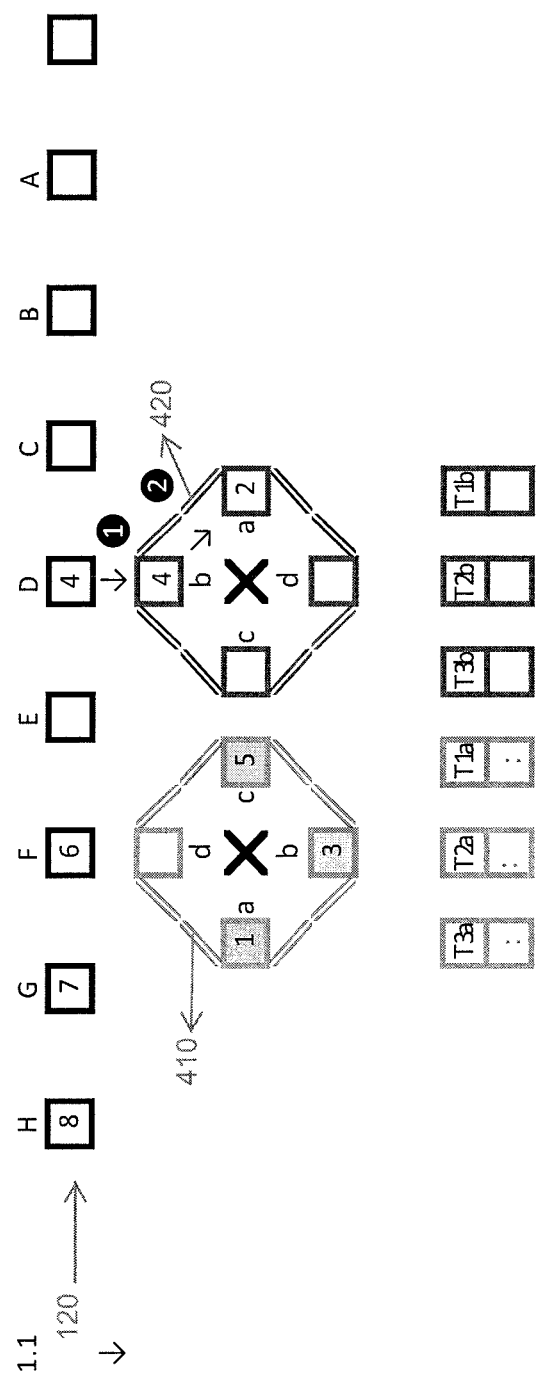

US 9,594,111 B2

TURRET HANDLERS AND METHODS OF OPERATIONS THEREOF

TECHNICAL FIELD

The present invention relates generally to semiconductor components, and more particularly to turret handlers and methods of operations thereof.

BACKGROUND

Semiconductor component manufacturers are constantly striving to increase the performance of their products, while decreasing their cost of manufacture. After forming, a semiconductor component may undergo testing, laser marking, and other operations. With increasing complexity of the semiconductor components, these operations may take considerable time slowing down production. Alternatively, they may require expensive test equipment. Both of these conventional approaches may result in an increase in production cost of the semiconductor component.

SUMMARY OF THE INVENTION

In accordance with an embodiment of the present invention, a method of testing a semiconductor component comprises loading a plurality of semiconductor components into a main turret of a turret handler, transporting the plurality of semiconductor components using the main turret to a test area, and splitting the plurality of semiconductor components into a first set and a second set. The method further comprises testing a first semiconductor component in the first set at a first test pad using a tester while transporting a second semiconductor component in the second set to a second test pad and testing the second semiconductor component using the tester while transporting the first semiconductor component out of the first test pad. The first set and the second set are merged into the plurality of semiconductor components and the plurality of semiconductor components are transported away from the test area using the main turret.

In accordance with an embodiment of the present invention, a semiconductor component testing system comprises a main turret comprising a first plurality of pickup heads for holding and sequentially transporting semiconductor components, a first secondary turret comprising a second plurality of pickup heads for holding and sequentially transporting semiconductor components, and a second secondary turret comprising a third plurality of pickup heads for holding and sequentially transporting semiconductor components. A first test pad is configured to contact a semiconductor component under a pickup head in the first secondary turret and a second test pad is configured to contact a semiconductor component under a pickup head in the second secondary turret. A tester node is configured to couple to a tester. The tester node is coupled to the first test pad and the second test pad.

In accordance with an alternative embodiment of the present invention, a semiconductor component testing system comprises a main turret comprising a first plurality of pickup heads for holding and sequentially transporting semiconductor components, a first table comprising a first plurality of test sockets for holding and contacting semiconductor components, and a second table comprising a second plurality of test sockets for holding and contacting semiconductor components. A first test clamp is configured to contact a test socket in the first plurality of test sockets. A second test clamp is configured to contact a test socket in the second plurality of test sockets. A tester node is configured to couple to a tester. The tester node is coupled to the first test clamp and the second test clamp.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 2, which includes FIGS. 2A-2C, illustrates a turret handler in accordance with embodiments of the present invention, wherein FIGS. 2A and 2B illustrate top views while FIG. 2C illustrates a cross-sectional view;

FIG. 3, which includes FIGS. 3A and 3B, illustrates a magnified illustration of the test station area in accordance with embodiments of the present invention;

FIG. 4, which includes FIGS. 4A and 4B, illustrates a scheduling sequence of the inner and outer turrets in accordance with an embodiment of the present invention, wherein the testing time in the schematic of FIG. 4A is less than the testing time in the illustration of FIG. 4B;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
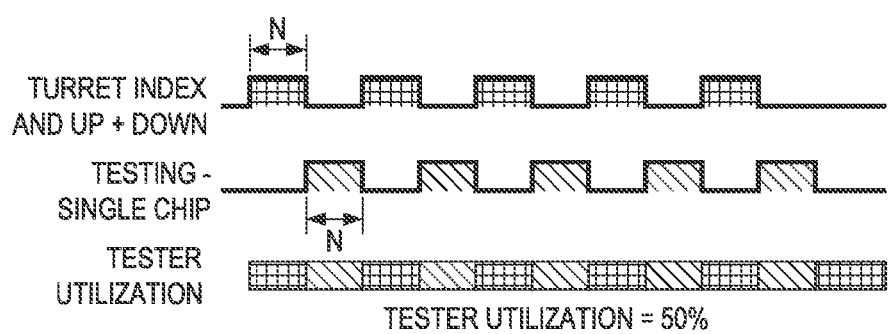
FIGS. 1A and 1B, illustrates a timing sequence of a conventional turret handling process, wherein the testing time in the schematic of FIG. 1A is less than the testing time in the illustration of FIG. 1B.
Figure 1B:
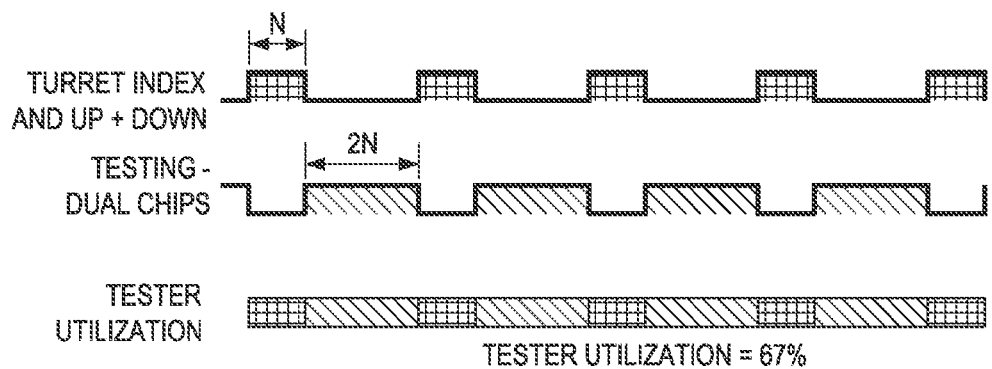

FIG. 1, which includes FIGS. 1A and 1B, illustrates a timing sequence of a conventional turret handling process during testing, wherein FIG. 1A illustrates a testing time less than the illustration in FIG. 1B.

Turret handlers are used to pick and transport semiconductor components around a turret during high volume production testing. Conventional turret handlers have between 12 and 32 pickup heads. The semiconductor components are held by the pickup heads using vacuum. The pickup heads lift or pickup the semiconductor components and transport them from one position to another within the round table of the turret handler.

Turret handlers are used for testing. In addition, turret handlers may be linked to sub-systems that allow electrical testing, laser marking, vision inspection, mark inspection, and packing processes. The time taken to pick and transport components is referred herein as the index time. On the other hand, the time when the turret table is idling or not moving is referred as sub-system time.

FIG. 1A illustrates the index time during which the semiconductor component is transported to the tester. This is illustrated as having a time of "N" units. The turret is picking up and transporting the semiconductor chip to the tester during this first pulse. During this time, the tester is idle because it is waiting for the semiconductor component to be transported, positioned, and placed within the testing holder.

Next, as illustrated by the time sequence of the tester in the second row, during the next time segment, the semiconductor component is tested for functionality. If the test time is about the same as the index time as in this illustration in FIG. 1A, the tester is utilized at a 50% rate. The third row illustrates the utilization rate of the tester. The total time period of the testing process is, therefore, the sum of the index time and the sub-system time. This results in a production rate of units per hour (UPH) for the semiconductor component.

In the second example in FIG. 1B, the tester takes a longer time than the illustration of FIG. 1B. This is illustrated as having twice the time (2N) in FIG. 1B. For example, the semiconductor component may be more complicated than the chip being tested in FIG. 1A, for example, the semiconductor component may include two chips. Consequently, as indicated by the second row of FIG. 1B, the sub-system time is longer than the index time. If the sub-system time is double the index time as in this example, the tester utilization improves. However, the total time period of the testing process increases. Consequently, this reduces the production rate to less than the first example.

Due to the nature of such working mechanism, most sub-systems are not able to perform its task during indexing. Consequently, depending on the sub-system time, utilization is often limited to around 50% to 70%. As electrical test system is progressively getting more complex and costly, increase of utilization represents opportunity for cost reduction. Embodiments of the present invention achieve a dramatic improvement in utilization as will be described below.

Embodiments of the present invention will be described using FIGS. 2-8. A turret handler will be described using FIG. 2. Alternative embodiments of the turret handler will be described using FIGS. 6 and 7. Embodiments of the operation of the turret handler will be described using FIGS. 3-5 and 8.

Figure 2A:
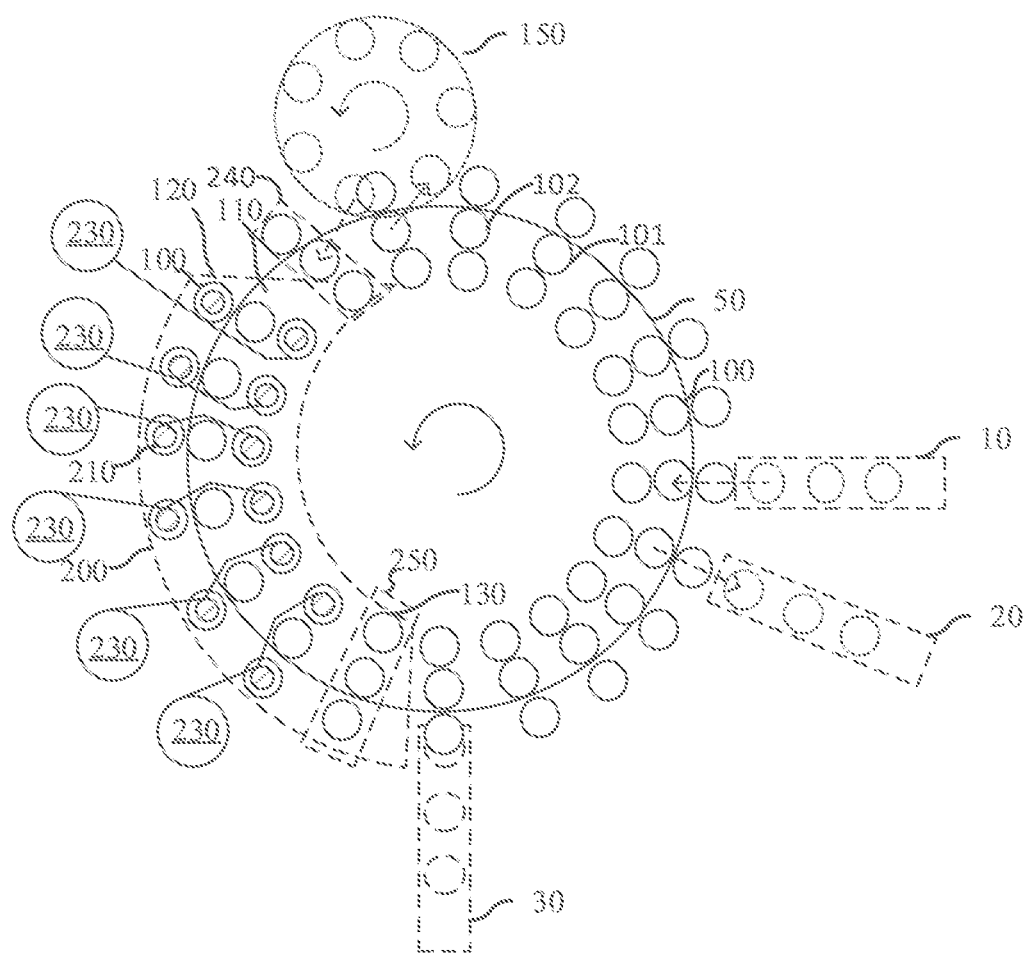

FIG. 2, which includes FIGS. 2A-2C, illustrates a turret handler in accordance with embodiments of the present invention. FIGS. 2A and 2B illustrate top views while FIG. 2C illustrates a cross-sectional view.

The turret handler is a component testing equipment having a turret plane 50, which rotates around a vertical axis. The turret plane 50 may include pickup heads 100. The semiconductor components are picked up by the pickup heads 100, for example, by vacuum. The picked up semiconductor component may be transported around the turret handler by the rotation of the turret plane 50.

As illustrated in FIG. 2, the turret handler may have various feed lines and output lines for transporting the semiconductor components into and out of the turret handler. For example, an input feed line 10 may be coupled to a portion of the turret handler and may be coupled through a tube, for example, from a bowl feeder. Similarly, the turret handler may include an output line 20 for removing the semiconductor components. In various embodiments, the turret handler may include multiple outputs, for example, semiconductor components that fail testing may be removed through a reject line 30.

Around the turret handler, different types of sub-systems may be attached. For example, as the semiconductor components are transported around the turret handler, activities such as alignment, temperature measurements, cooling, top vision testing, bottom vision testing, laser marking, functionality testing, and others may be performed.

In various embodiments, these stations may perform directly on the main turret or may themselves include independent pickup heads. As an illustration, a sub-unit 150 may be attached around the turret plane 50. The semiconductor components may be transported from the turret plane 50 to the pickup head of the sub-unit 150. The semiconductor components may undergo a process such as laser marking.

As illustrated in FIG. 2, in various embodiments the turret handler includes multiple turrets. An inner turret 110, a main turret 120, and an outer turret 130 are disposed in a concentric manner in, below, or above the turret plane 50. Each of the inner turret 110, the main turret 120, and the outer turret 130 are independent such that they may rotate without the other turret rotating. For example, each of the inner turret 110, the main turret 120, and the outer turret 130 may be coupled to a servo drive motor and control circuitry to control and drive the corresponding turret. For example, a semiconductor component may be picked up by a pickup head of the inner turret 110, a pickup head of the main turret 120, or a pickup head of the outer turret 130 and transported around the central vertical axis of the turret handler.

In various embodiments, a test station area 200 is attached to the turret handler. The test station area 200 includes a plurality of test pads 210 disposed under the pickup heads 100 of the inner turret 110 and the outer turret 130. Further, in one embodiment, the plurality of test pads 210 are coupled to a plurality of test stations 230. Each test station of the plurality of test stations 230 couples to at least two test pads. In one embodiment, each test station is coupled to a test pad of the plurality of test pads 210 under the inner turret 110 and a test pad of the plurality of test pads 210 under the outer turret 130.

As further illustrated, the turret handler includes a splitting stage 240 and a merging stage 250. The splitting stage 240 transfers the semiconductor components from the main turret 120 to the inner turret 110 or the outer turret 130. In contrast, the merging stage 250 transfers the semiconductor components from the inner turret 110 or the outer turret 130 to the main turret 120. The operation of the splitting stage 240 and the merging stage 250 will be described below in detail. Upon testing each semiconductor component through the plurality of test stations 230, the accepted or passed semiconductor components pass through the output line 20, which may be multiple lines.

For illustration, testing is used, however, in other embodiments, operations such as laser marking, vision testing, and others, if time consuming, may be performed using the multiple turrets described in various embodiments.

Figure 3B:
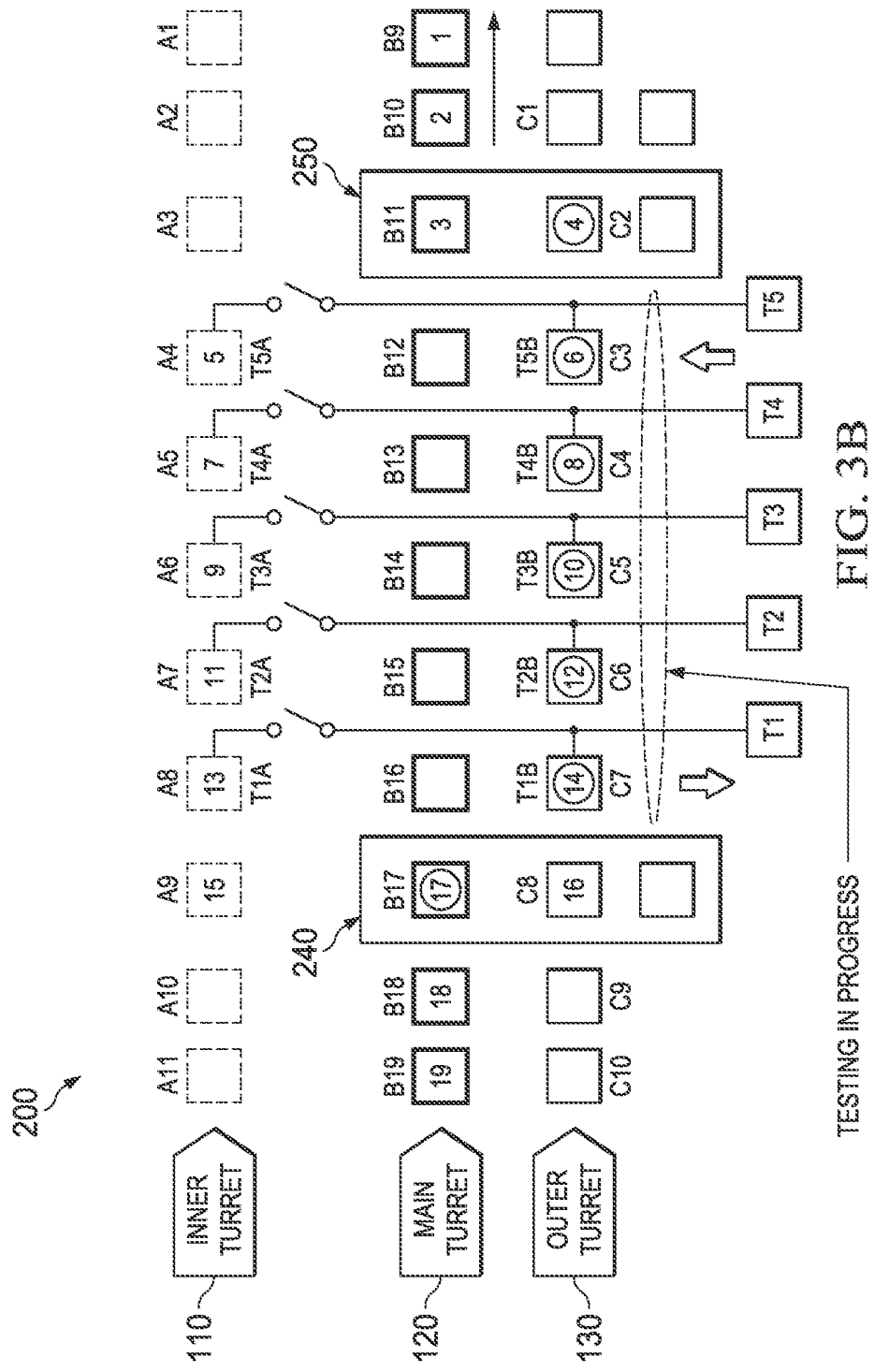

FIG. 3, which includes FIGS. 3A and 3B, illustrates a magnified illustration of the test station area in accordance with embodiments of the present invention.

Referring to FIG. 3A, as described above with respect to FIG. 2, embodiments of the present invention use additional turrets such as the inner turret 110 and the outer turret 130 besides the main turret 120. For clarity in this illustration, the plurality of pickup heads 100 illustrated in FIG. 2 is categorized based on its location with respect to the turret. As illustrated in FIG. 3A, a plurality of first pickup heads (A1, A2, A3, A4) are located in the inner turret 110, a plurality of second pickup heads (B1, B2, B3, B4) are located in the main turret 120, and a plurality of third pickup heads (C1, C2, C3, C4) are located in the outer turret 130.

Similarly, a plurality of first test pads (T1$a$, T2$a$, T3$a$, T4$a$, T5$a$, ...) is located under the pickup heads of the inner turret 110, while a plurality of second test pads (T1$b$, T2$b$, T3$b$, T4$b$, T5$b$, ...) is located under the pickup heads of the outer turret 130. The plurality of test stations 230 are illustrated as a first station T1, a second station T2, a third station T3, a fourth station T4, and a fifth station T5.

Each test pad of the plurality of first test pads and each test pad of the plurality of second test pads is coupled in parallel to the test stations. For example, the test pad T1$a$ of the plurality of first test pads and the test pad T1$b$ of the plurality of second test pads is coupled to a first station T1.

FIG. 3A also illustrates a splitting stage 240 and a merging stage 250, which are configured to move laterally (radially inward or outward) as illustrated by the direction of the arrows. The inner turret 110, the main turret 120, and the outer turret 130 are configured to move laterally perpendicular (along the perimeter in FIG. 2) to the movement of the splitting stage 240 and the merging stage 250.

FIG. 3A illustrates the semiconductor components before entering the test station area. Therefore, all the semiconductor components are in the main turret 120. The turret handler is configured to handle semiconductor components (1, 2, 3, 4, ...), which are being fed into the test station area 200 from the main turret 120. For illustration, the semiconductor components are sequentially arranged in the main turret 120 before entering the test station area 200. Accordingly, the first semiconductor component 1 is the first to enter the test station area 200.

FIG. 3B illustrates the magnified illustration of the test station area during a subsequent stage of operation in accordance with embodiments of the present invention.

In various embodiments, during operation, the semiconductor components are fed into the test station area 200 in a continuous mode. The splitting stage 240 moves the semiconductor components from the main turret 120 to the inner turret 110 and the outer turret 130 in alternating manner. For example, a first semiconductor component 1 is transported to the inner turret 110 while a second semiconductor component 2 is transported to the outer turret 130. Thus, in the illustration in FIG. 3B, the odd numbered semiconductor components are transported to the inner turret 110 while the even numbered semiconductor components are transported to the outer turret 130. Accordingly, in various embodiments, testing or other operations may be performed in parallel rows. In various embodiments, any time consuming operation may be performed.

Similarly, after testing or other operations, the merging stage 250 moves the semiconductor components from the inner turret 110 to the main turret 120 and from the outer turret 130 to the main turret 120. In other words, the splitting stage 240 splits the incoming feed into two or more lines while the merging stage 250 combines multiple lines into the single outgoing feed.

In various embodiments, the inner turret 110 and the outer turret 130 are out of phase by 180. Therefore, when the inner turret 110 moves, the outer turret 130 is stationary. Similarly, when the outer turret 130 moves, the inner turret 110 is stationary. The main turret 120 operates at twice the frequency of the inner turret 110 and the outer turret 130. Thus, whenever either the inner turret 110 or the outer turret 130 moves, the main turret 120 also moves. In alternative embodiments, three additional turrets may be provided along with the main turret. In such an embodiment, the main turret has a frequency three times the frequency of the three additional turrets. Thus, embodiments of the present invention may be used in various embodiments with more than two additional turrets. For clarity, only two additional turrets are illustrated.

Further, in various embodiments, the testing of a tester such as a first tester T1 alternates between a first test pad T1$a$ at the inner turret 110 and a parallel first test pad T1$b$ at the outer turret 130. Consequently, the utilization of the tester is vastly improved in various embodiments of the present invention.

Accordingly, in various embodiments, advantageously, the semiconductor components move out from test stations and channel out through the main turret 120 in a continuous mode, and thus do not impact subsequent processing.

As illustrated in FIG. 3B, the first few semiconductor components (1, 2, and 3) have completed processing at the test station area. Some of the odd indexed semiconductor components (5, 7, 9, 11, and 13) are at different stages of testing and are being positioned and transported by the inner turret 110. Similarly, some of the even indexed semiconductor components (6, 8, 10, 12, and 14) are being tested and controlled by the outer turret 130.

Figure 4B:
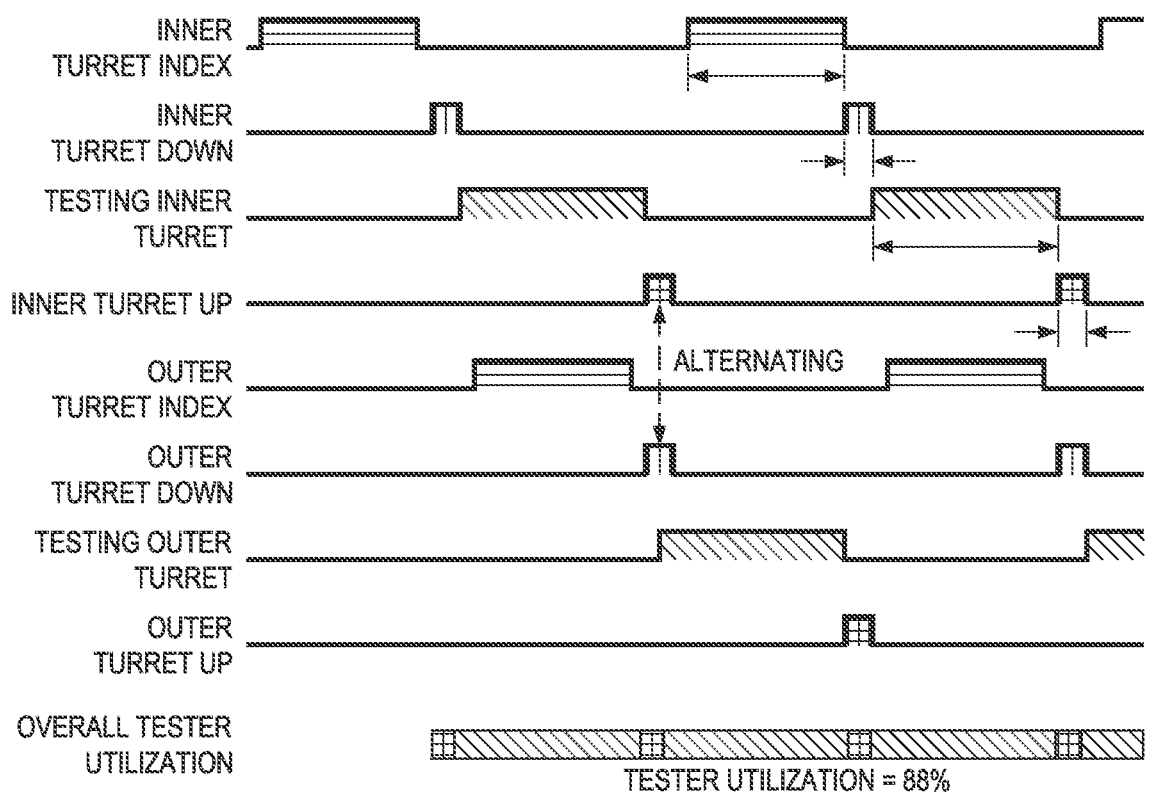

FIG. 4, which includes FIGS. 4A and 4B, illustrates a scheduling sequence of the inner and outer turrets in accordance with an embodiment of the present invention.

Referring to FIG. 4A, the first row illustrates the index time of the inner turret 110 (e.g., as illustrated in FIG. 3). During the index time, the inner turret 110 transports the semiconductor components. As illustrated in the second row of FIG. 4A, during the turret down time, the inner turret 110 lowers the semiconductor component onto a test pad or lowers the semiconductor component onto the merging stage 250. As next illustrated in the third row, during a testing time, the semiconductor component in the inner turret 110 is held on a test site and is being tested. As illustrated in the fourth row of FIG. 4A, during the up time, the inner turret 110 picks up the semiconductor component from the splitting stage 240 or from a test pad.

Similarly, the outer turret 130 has an index time, which is 180° out of phase with the inner turret 110. As illustrated in the fifth row of FIG. 4A, during the index time, the outer turret 130 transports the semiconductor components. As illustrated in the sixth row, during the turret down time, the outer turret 310 lowers the semiconductor component onto a test pad or lowers the semiconductor component onto the merging stage 250. As next illustrated in the seventh row, during a testing time, the semiconductor component is held on a test site in the outer turret 130 and is being tested. As illustrated in the eighth row of FIG. 4A, during the up time, the outer turret 130 picks up the semiconductor component from the splitting stage 240 or from a test pad.

As is clear from FIG. 4A, when the inner turret 110 is picking up semiconductor components, the outer turret 130 is placing semiconductor components and vice versa. Thus, the two turrets maintain a constant phase difference.

Further, during the testing operation at the inner turret 110, the outer turret 130 is transporting the semiconductor component to the tester. Therefore, the testing operation is performed at the inner turret 110 at a different time than at the outer turret 130. This enables a higher utilization of the tester in various embodiments. This is illustrated in the ninth row, which shows the utilization of the tester. The cycle time is dramatically reduced as only the down time adds to the actual testing time. Thus, with a reduced cycle time (relative to FIG. 1A), a greater number of units per hour may be processed in this specific example with a tester utilization rate of 75%.

FIG. 4B illustrates an alternative sequence in which the tester takes a longer time for the testing operation, for example, due to the complexity of the semiconductor component.

Figure 5A:
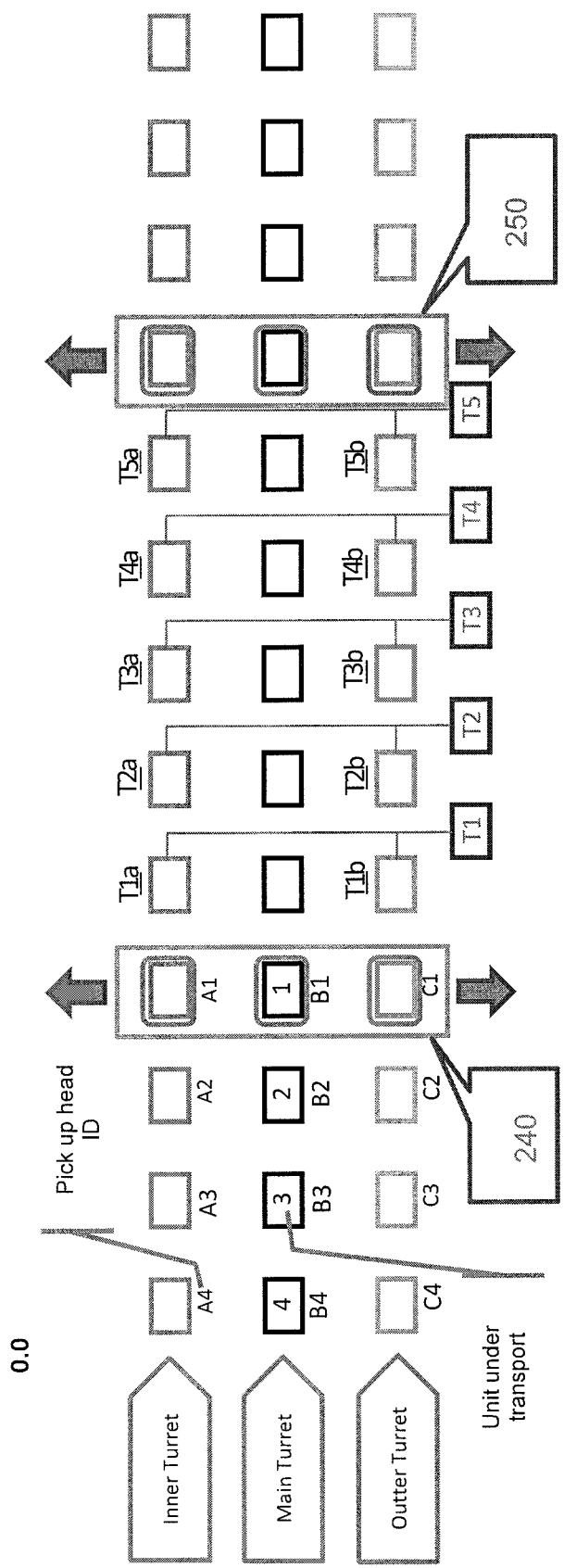
FIG. 5, which includes FIGS. 5A-5AH, illustrates a magnified illustration of the test station area of a turret handler comprising a plurality of additional turrets during processing of semiconductor components in accordance with an embodiment of the invention.
Figure 5B:
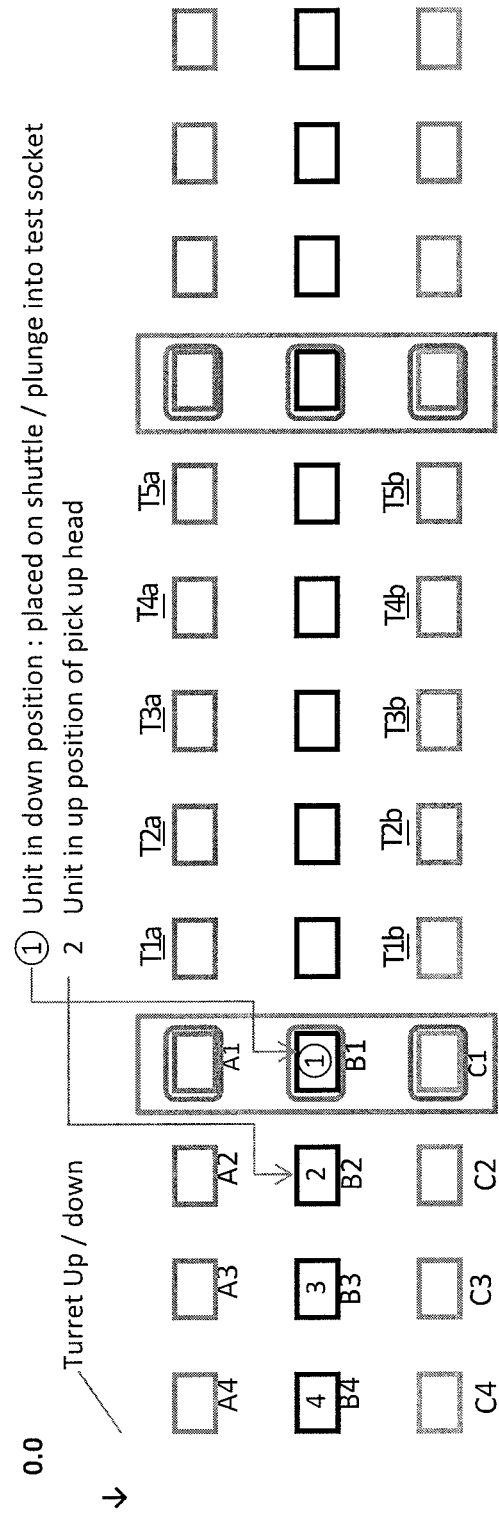

FIG. 5, which includes FIGS. 5A-5AH, illustrates a turret handler comprising a plurality of additional turrets during processing of semiconductor components in accordance with an embodiment of the invention. FIG. 5 illustrates the turret handling after each process step used in the embodiments of FIGS. 2-4.

As illustrated in FIG. 5A, a plurality of first pickup heads (A1, A2, A3, A4) are located in the inner turret 110, a plurality of second pickup heads (B1, B2, B3, B4) are located in the main turret 120, and a plurality of third pickup heads (C1, C2, C3, C4) are located in the outer turret 130. Similarly, a plurality of first test pads (T1a, T2a, T3a, T4a, T5a, . . . ) is located under the pickup heads of the inner turret 110, while a plurality of second test pads (T1b, T2b, T3b, T4b, T5b, . . . ) is located under the pickup heads of the outer turret 130. The plurality of test stations 230 are illustrated as a first station T1, a second station T2, a third station T3, a fourth station T4, and a fifth station T5.

Figure 5C:
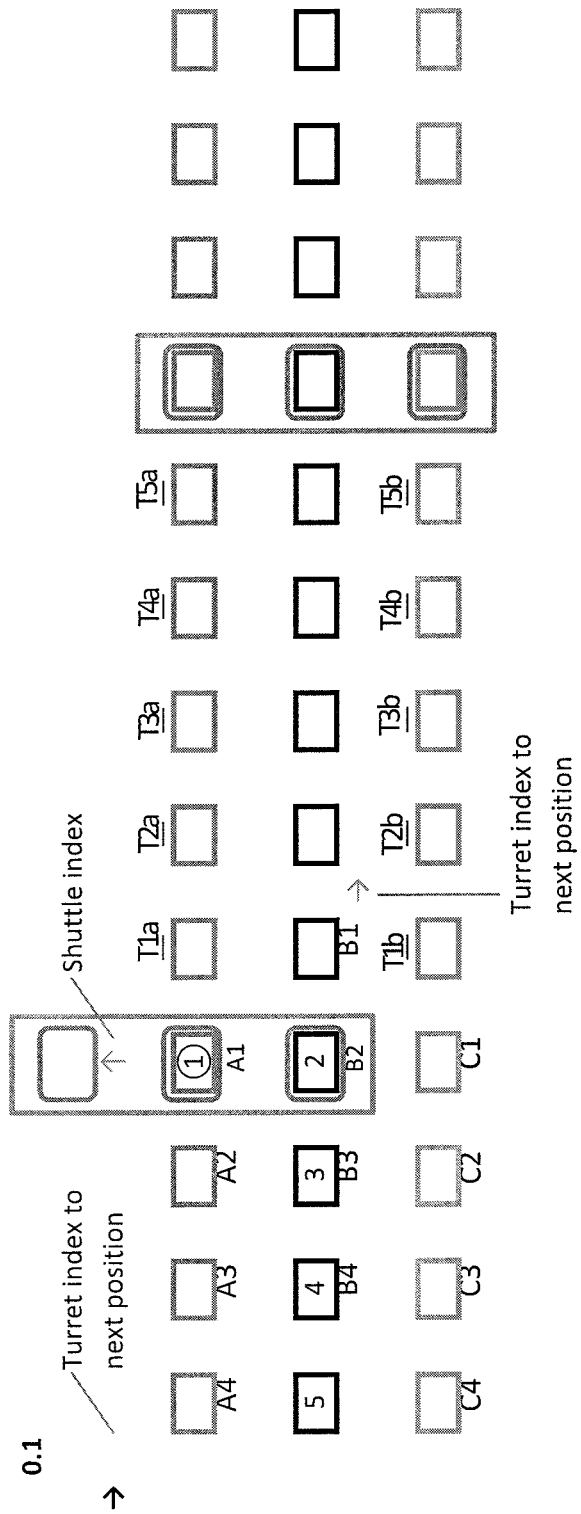

Referring to FIG. 5A, a pickup head B1 in the main turret 120 holding a first semiconductor component 1 reaches directly above the splitting stage 240. As next illustrated in FIG. 5B, the pickup head B1 lowers the first semiconductor component 1 onto the splitting stage 240. Referring to FIG. 5C, the splitting stage 240 moves laterally (radially inward in FIG. 2) so as to align the first semiconductor component 1 below a pickup head A1 of the inner turret 110. At the same time, the main turret 120 moves by one location so that the second semiconductor component 2 is directly below the splitting stage 240.

Figure 5D:
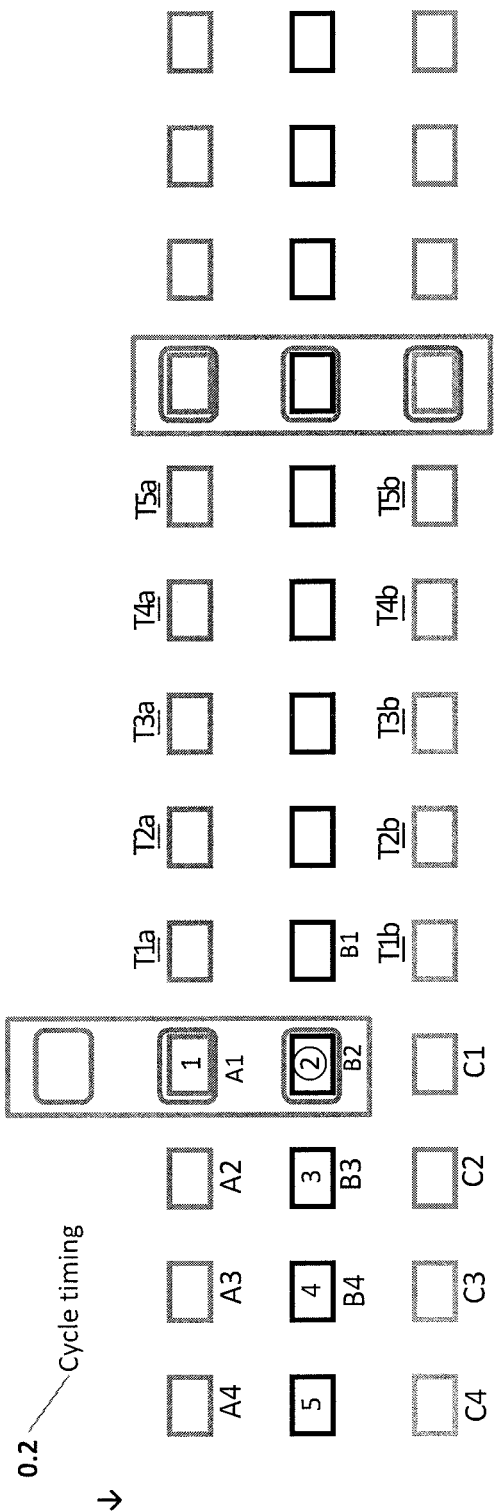
Figure 5E:
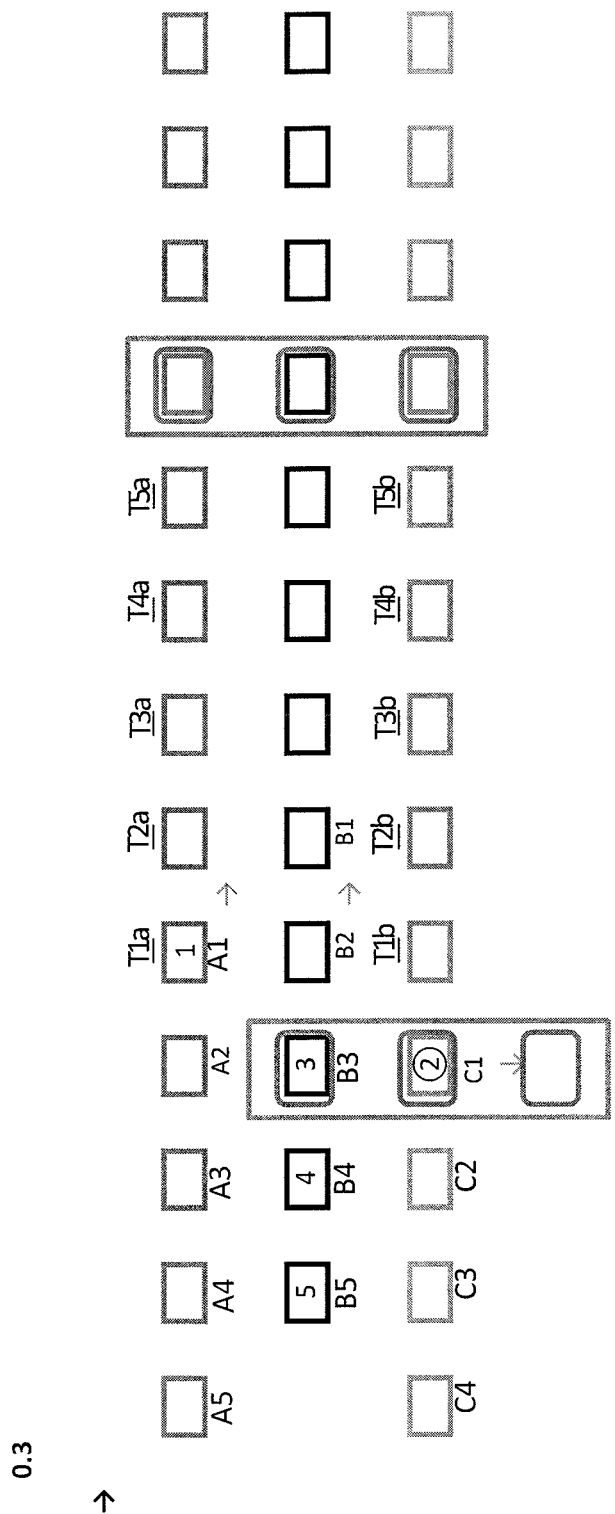

Referring next to FIG. 5D, the first semiconductor component 1 is picked up by the pickup head A1 of the inner turret 110. Further, the second semiconductor component 2 is lowered onto the splitting stage 240. As next illustrated FIG. 5E, the first semiconductor component one is positioned under the first test pad A1, while the main turret 120 and the splitting stage 240 are moved. Thus, the second semiconductor component 2 is placed under the pickup head C1 of the outer turret 130.

Figure 5F:
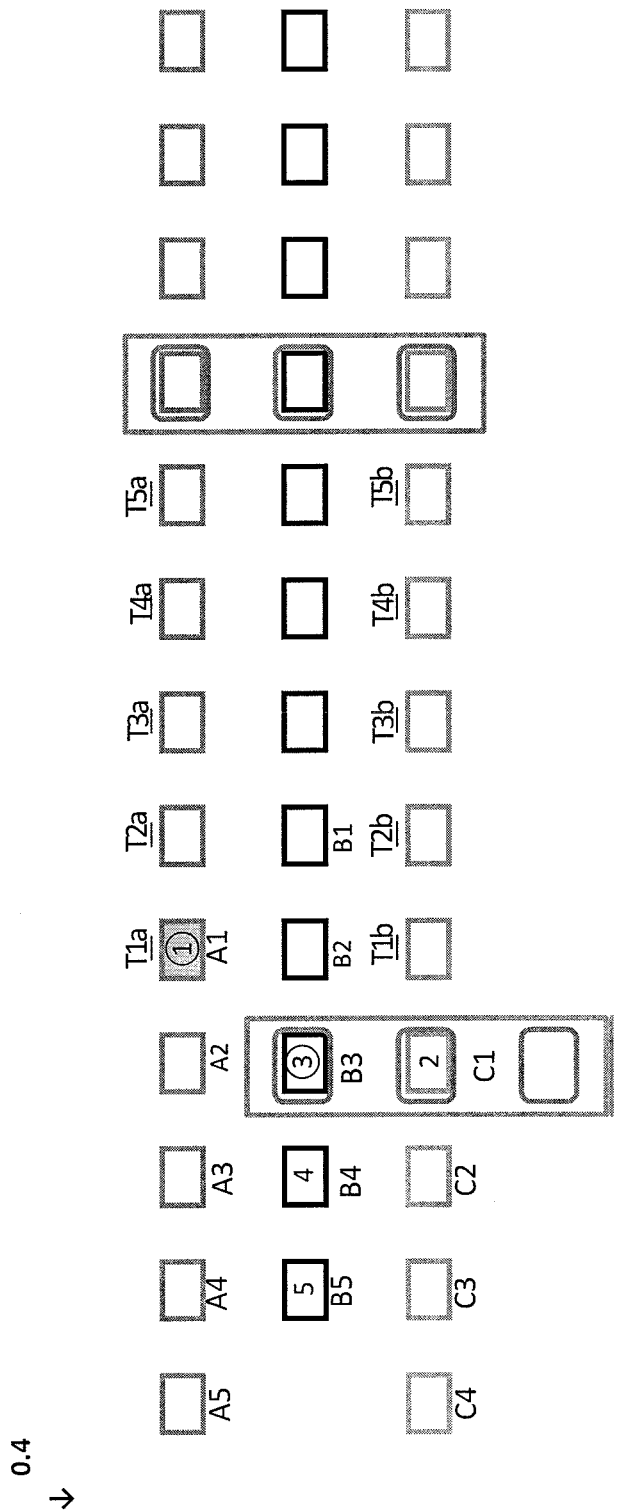

Referring to FIG. 5F, the first semiconductor component 1 is placed on the test pad T1a while the second semiconductor component 2 is picked up by the pickup head C1 of the outer turret 130. Further, the third semiconductor component 3 is placed onto the splitting stage 240.

Figure 5G:
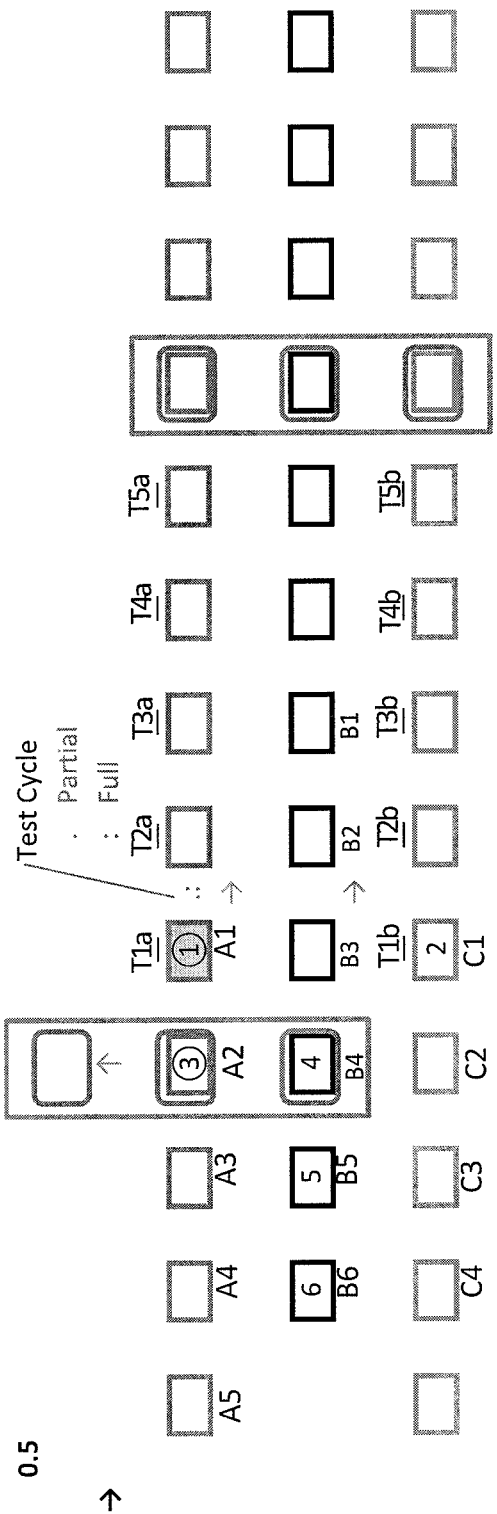
Figure 5H:
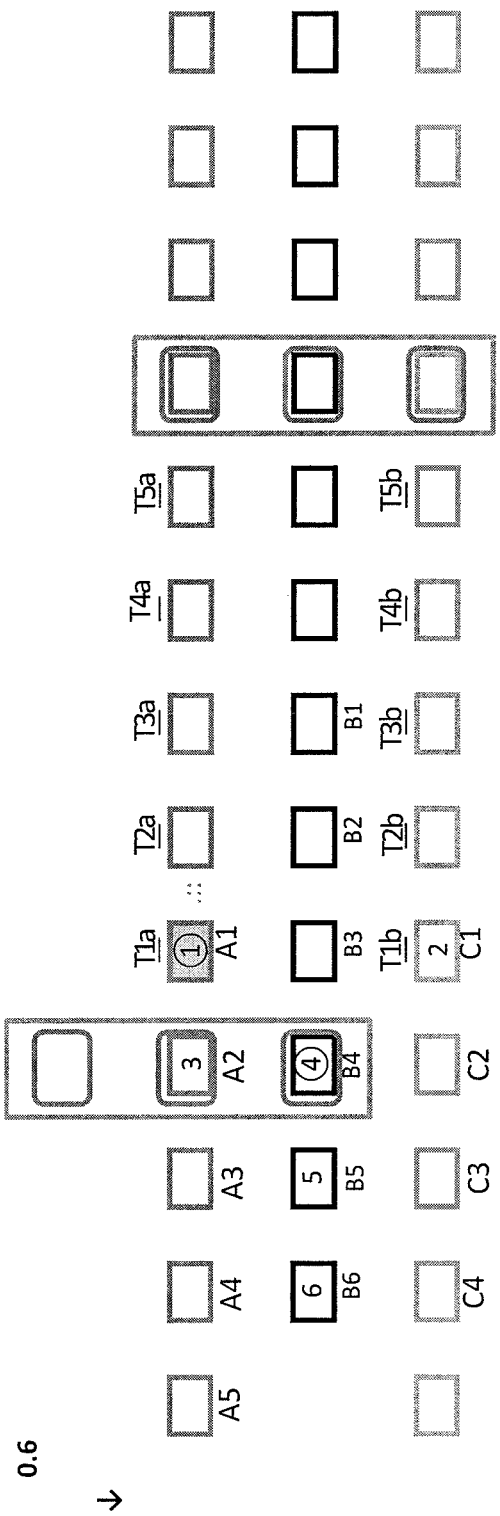
Figure 51:
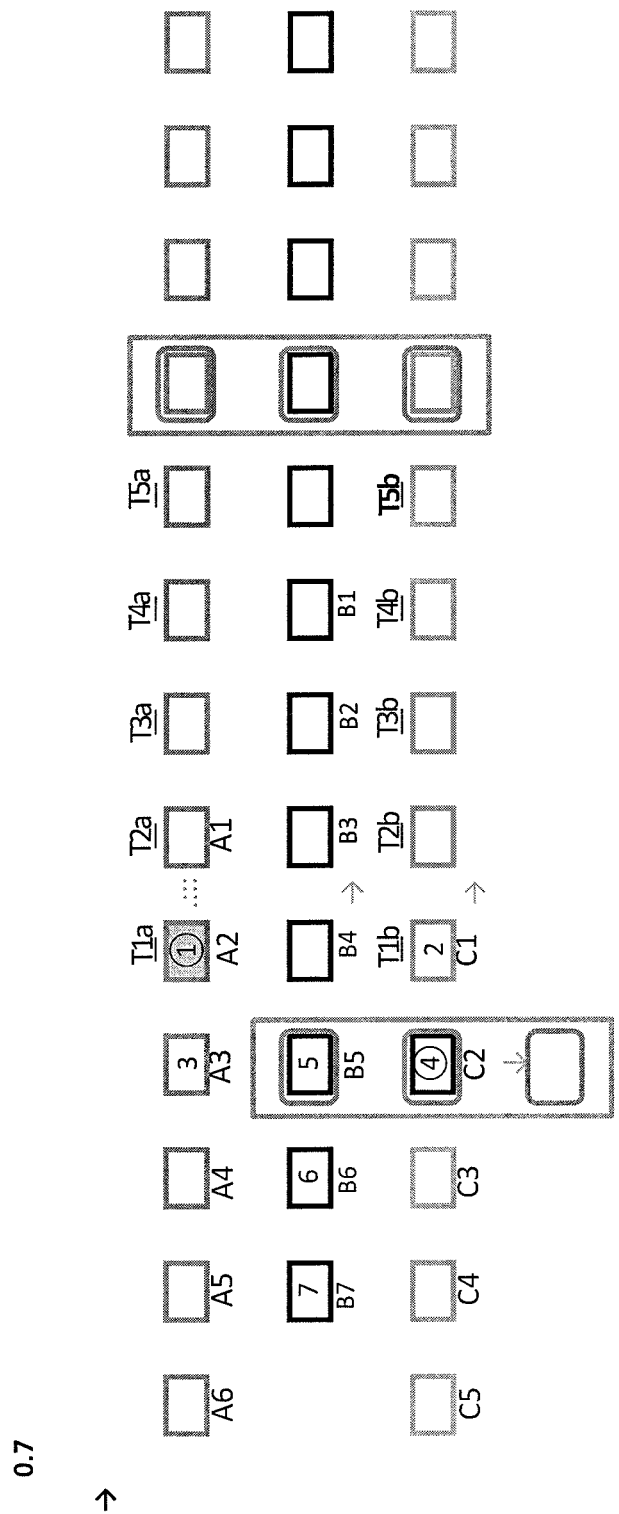

As next illustrated in FIG. 5G, the third semiconductor component 3 is transported to the inner turret 110 and placed below a second pickup head A2 of the inner turret 110. At the same time the main turret 120 and the outer turret 130 are rotated so that the second semiconductor component 2 is positioned above the test station T1b. The first semiconductor component 1 begins to be tested at the first test site T1a. Referring to FIG. 5H, the fourth semiconductor component 4 is placed on the splitting shutter 240 while the first semiconductor component 1 continues to be tested.

Figure 5J:
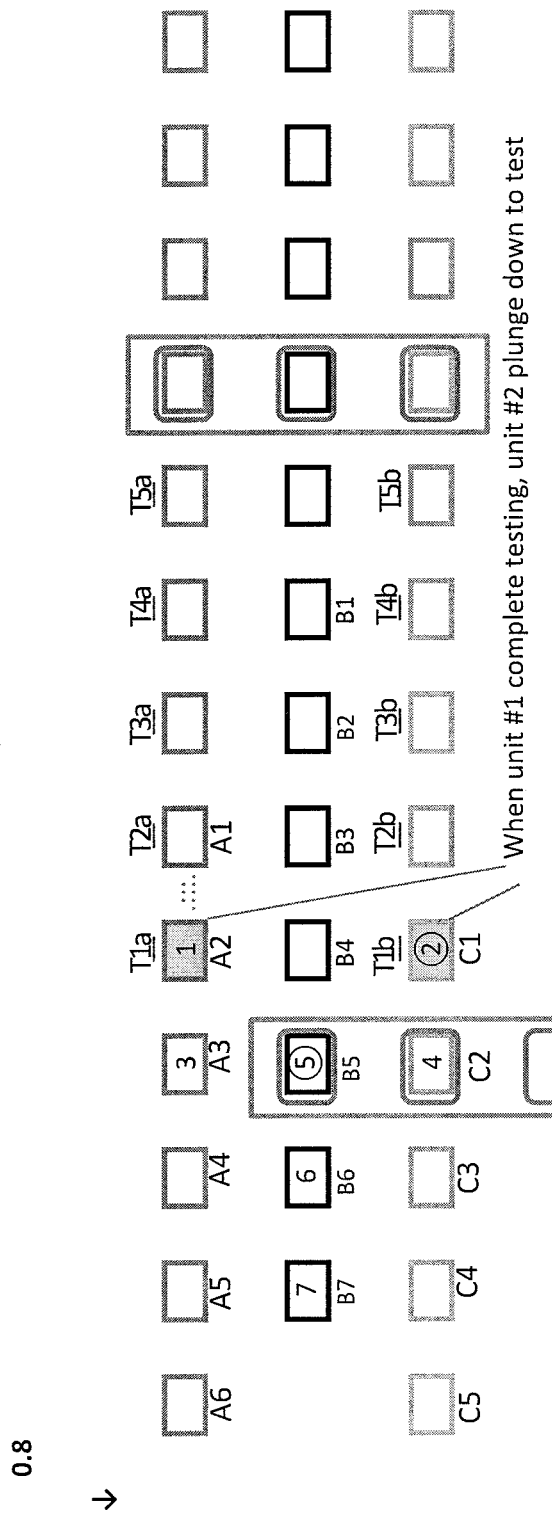

As next illustrated in FIG. 5I, the splitting stage 240 is moved to place the fourth semiconductor component 4 under the second pickup head C2 of the outer turret 130. Further, the main turret 120 moves by one location. Referring next to FIG. 5J, the first semiconductor component 1 has finished testing. Therefore, the first semiconductor component 1 is picked up by the second pickup head A2 of the inner turret 110. In parallel, the second semiconductor component 2 is placed onto the test pad T1b. Further, the fourth semiconductor component 4 is picked up from the splitting stage 240 by the second pickup head C2 of the outer turret 130. The fifth semiconductor component 5 is placed onto the splitting stage 240.

Figure 5K:
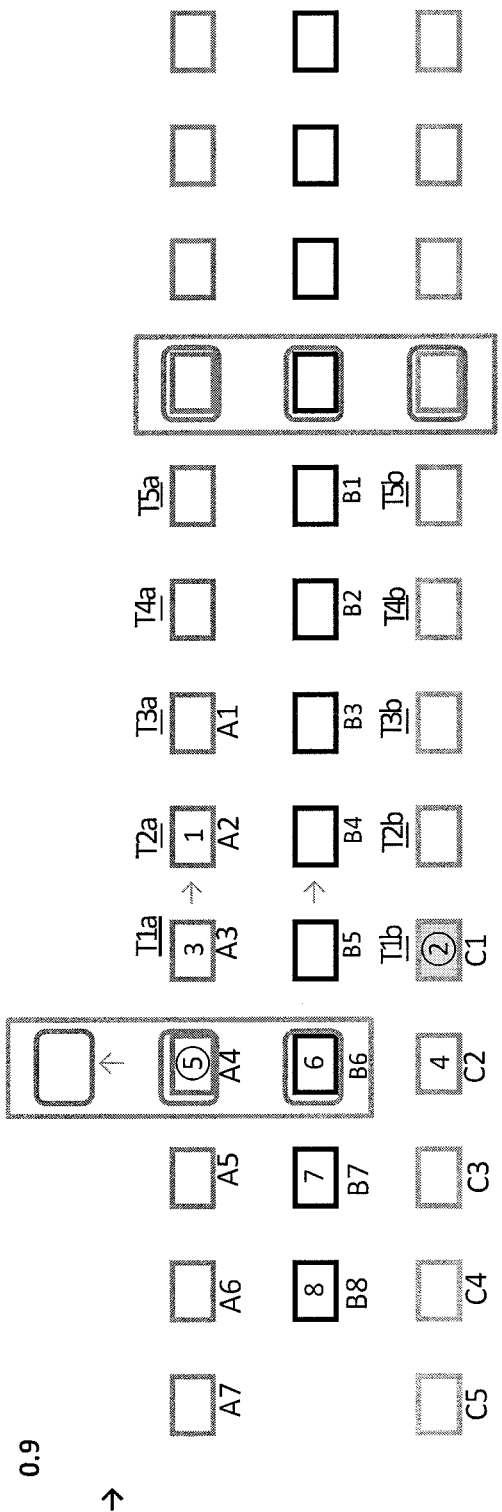

Referring to FIG. 5K, testing of the second semiconductor component 2 begins. Further, the main turret 120 and the inner turret 110 are moved. Further, the splitting stage 240 transports the fifth semiconductor component 5 from the main turret 120 to the inner turret 110 and aligns the fifth semiconductor component 5 under the fourth pick up head A4 of the inner turret 110.

Figure 5L:
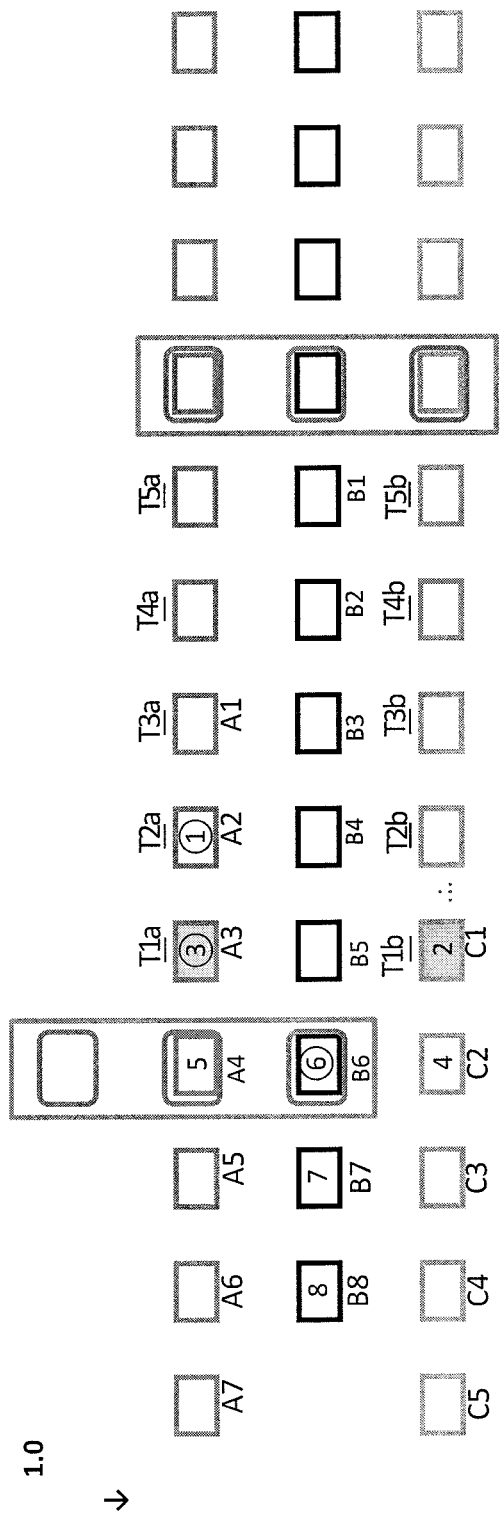

As next illustrated in FIG. 5L, the testing of the second semiconductor component 2 is finished and the second semiconductor component 2 is picked up by the first pickup head C1 of the outer turret 130. The third semiconductor component 3 is placed onto the test pad T1a while the first semiconductor component 1 is placed onto the test pad T2a. The fifth semiconductor component 5 is picked up by the fourth pick up head A4 of the inner turret 110. The sixth semiconductor component 6 is placed onto the splitting stage 240.

Figure 5M:
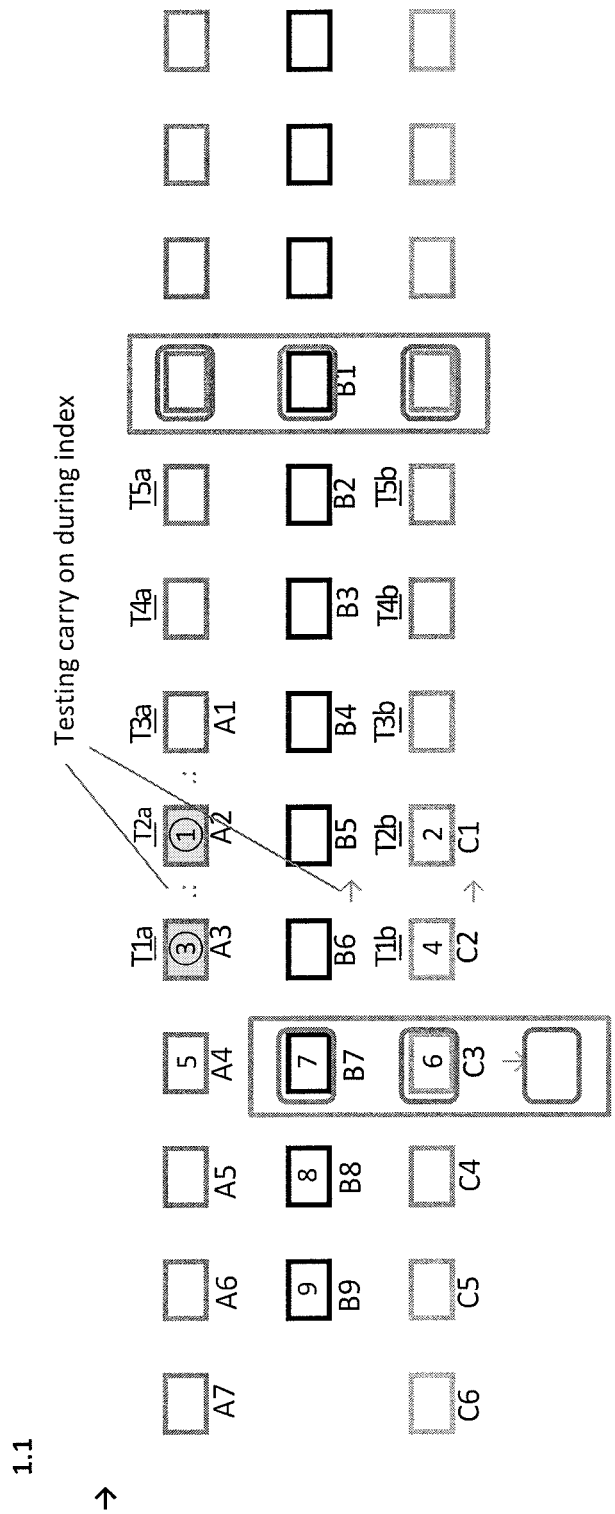

Referring to FIG. 5M, the main turret 120 and the inner turret 130 are moved or rotated. Further, the splitting stage 240 is moved so as to align the sixth semiconductor component 6 under the third pick up head C3 of the outer turret 130. The first semiconductor component 1 and the third semiconductor component 3 begin testing at the test pads T2a and T1a respectively.

Figure 5N:
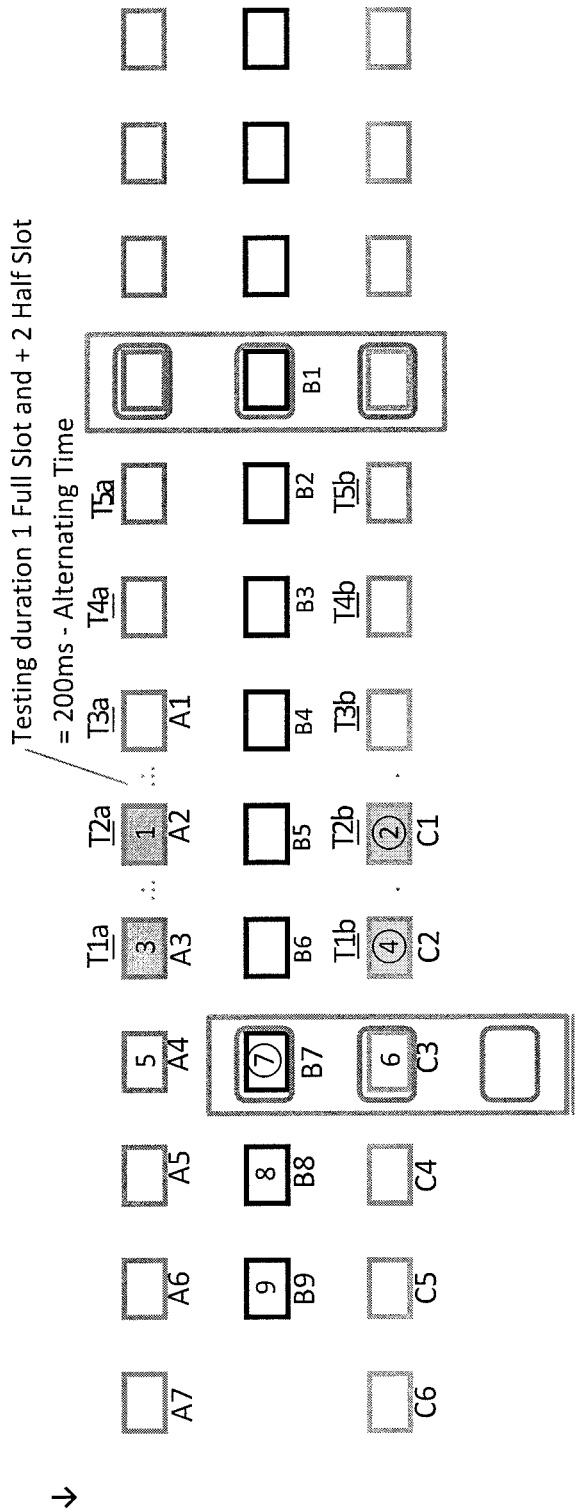
Figure 50:
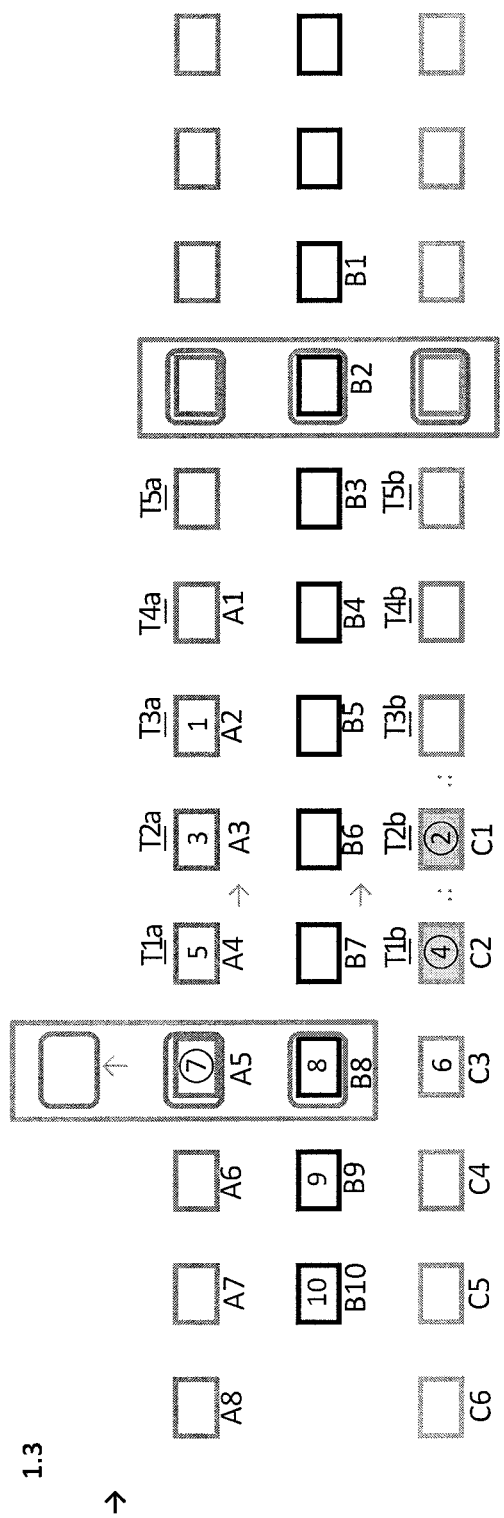

Continuing onto FIG. 5N, the first semiconductor component 1 and the third semiconductor component 3 are picked up while the second semiconductor component 2 and the fourth semiconductor component 4 are placed onto the test pads T2b and T1b respectively. Further, the sixth semiconductor component 6 is picked up from the splitting stage 240 while the seventh semiconductor component 7 is placed onto the splitting stage 240.

Referring next to FIG. 5O, the splitting stage 240 is moved so as to align the seventh semiconductor component 7 under the fifth pick up head A5 of the inner turret 110. The inner turret 110 and the main turret 120 are moved. The second semiconductor component 2 and the fourth semiconductor component 4 begin testing at the test pads T2b and T1b respectively.

Figure 5P:
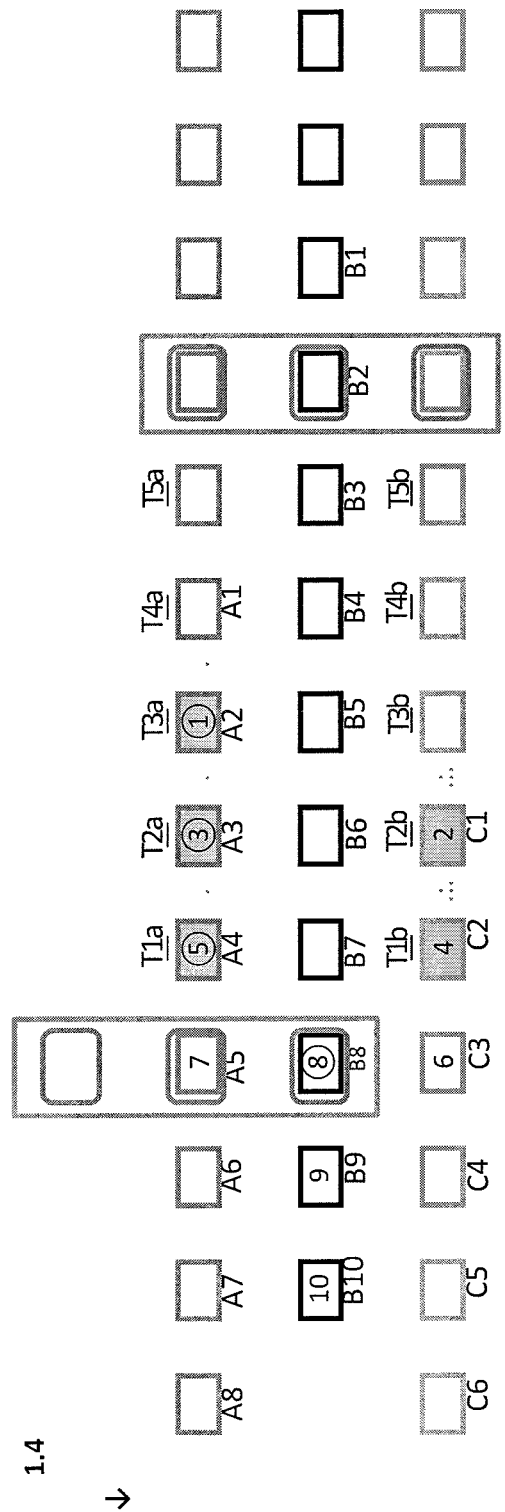

As next illustrated in FIG. 5P, an eighth semiconductor component 8 is placed on the splitting shutter 240. The first, the third, and the fifth semiconductor components 1, 3, and 5 are placed onto a test pads T3a, T2a, and T1a respectively. The second and the fourth semiconductor components 2 and 4 are picked up from the test pads T2b and T1b respectively. Similarly, the seventh semiconductor component 7 is picked up by the fifth pick up head A5 of the inner turret 110.

Figure 5Q:
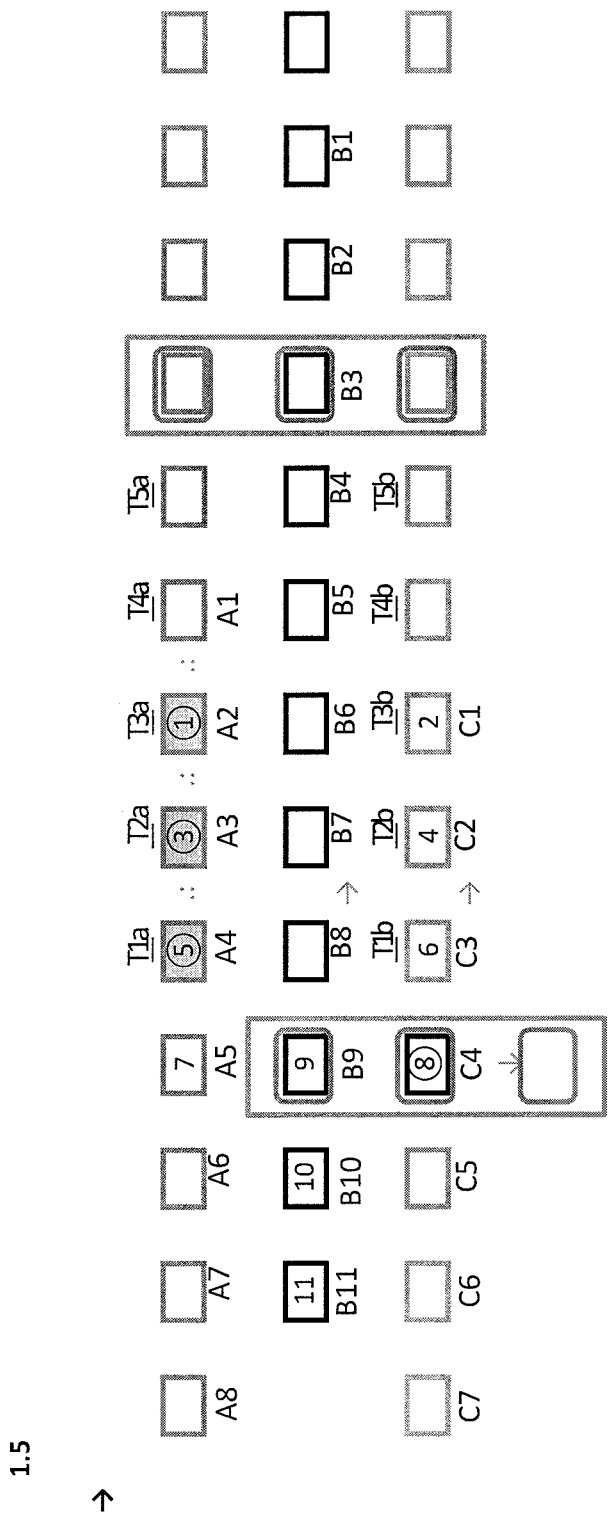

Moving onto FIG. 5Q, the splitting stage 240 is moved so that the eighth semiconductor component is positioned under the fourth pick up head C4 of the outer turret 130. The main turret 120 and the outer turret 130 are rotated while the first, the third, and the fifth semiconductor components 1, 3, and 5 undergo testing at test pads T3a, T2a, and T1a respectively.

Figure 5R:
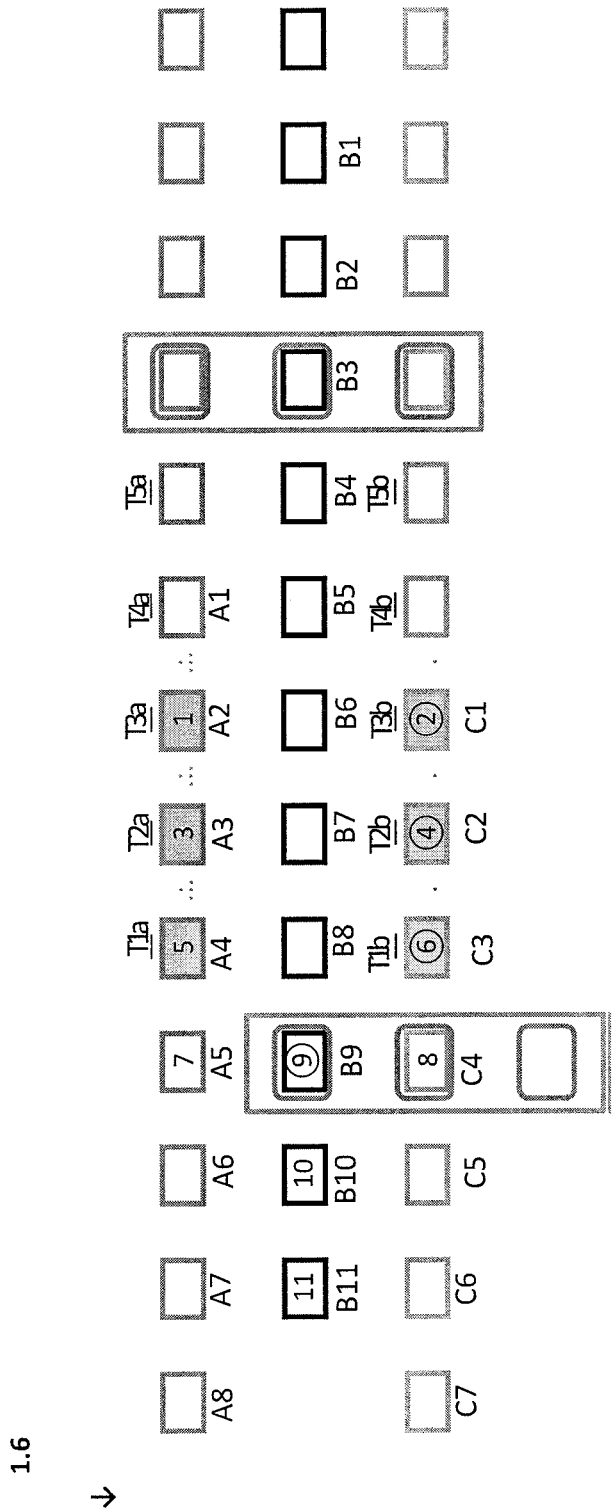
Figure 5S:
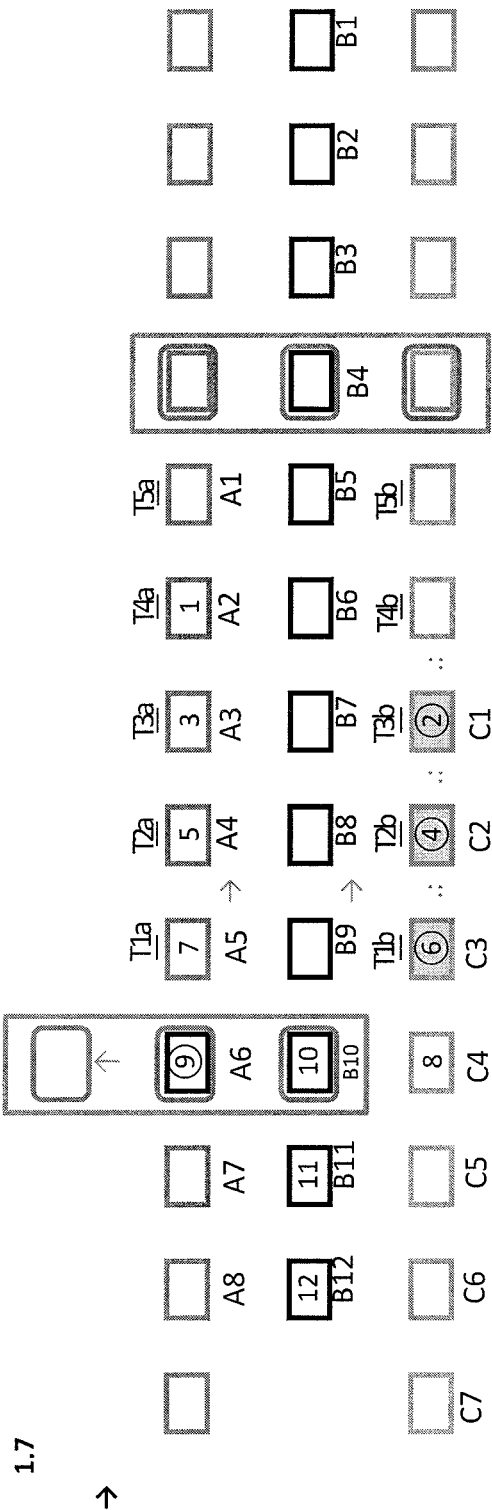
Figure 5T:
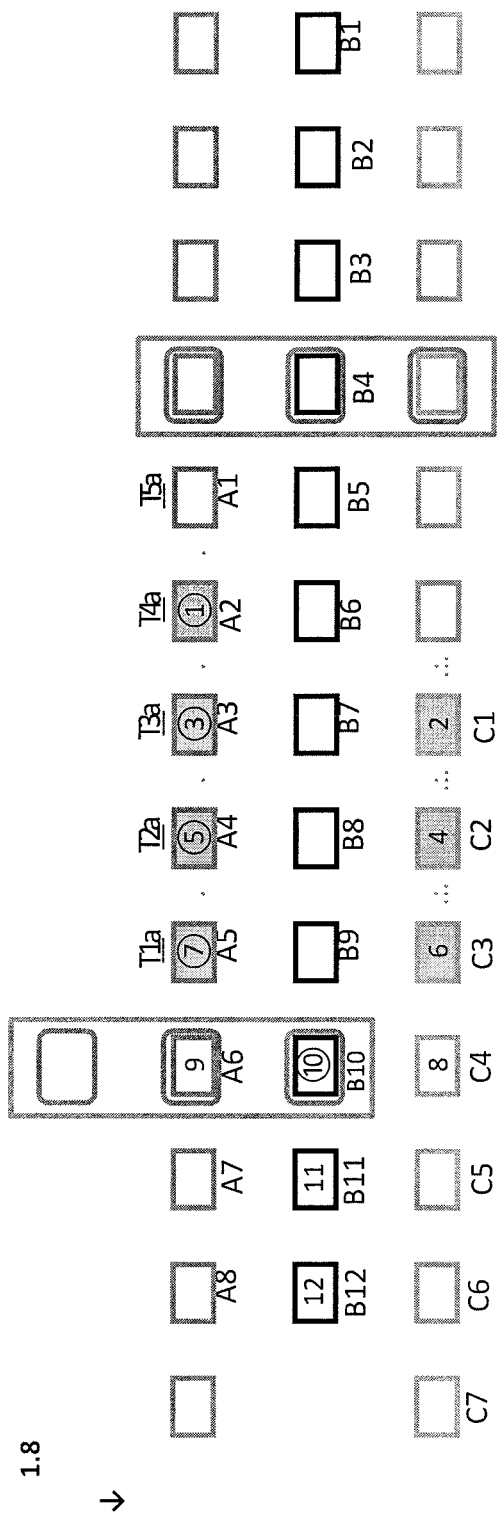
Figure 5U:
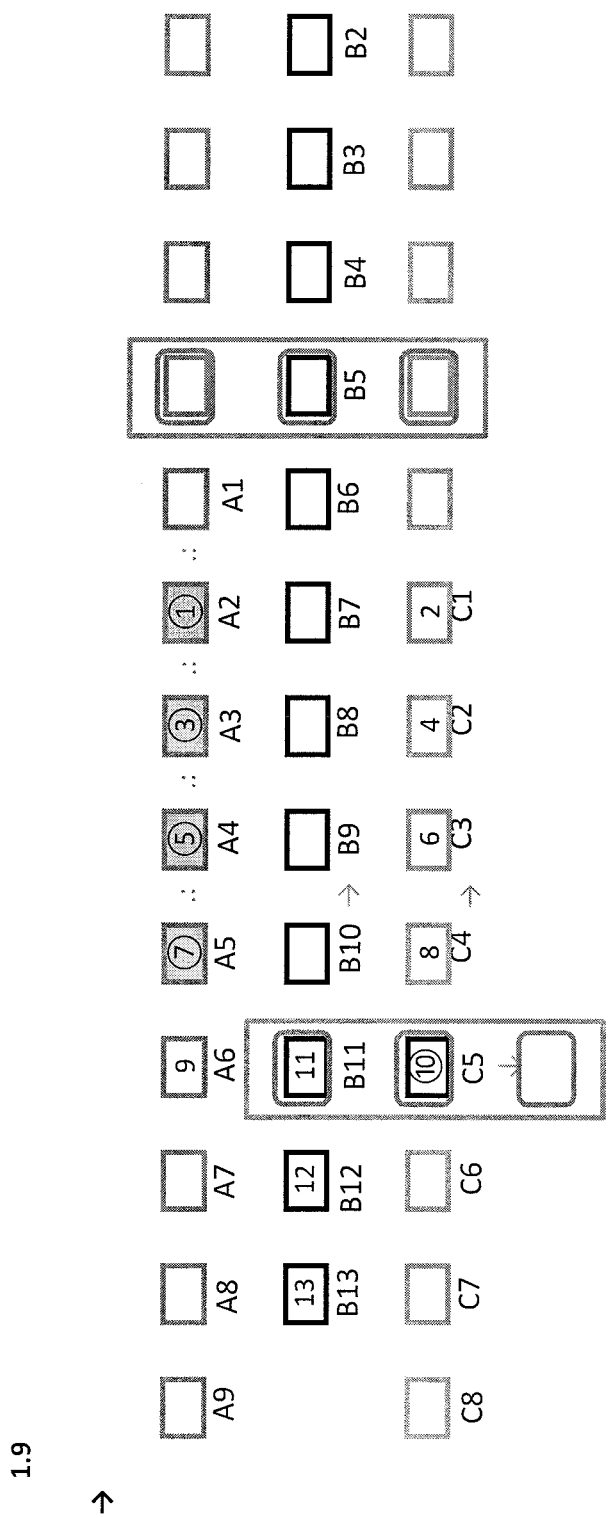
Figure 5V:
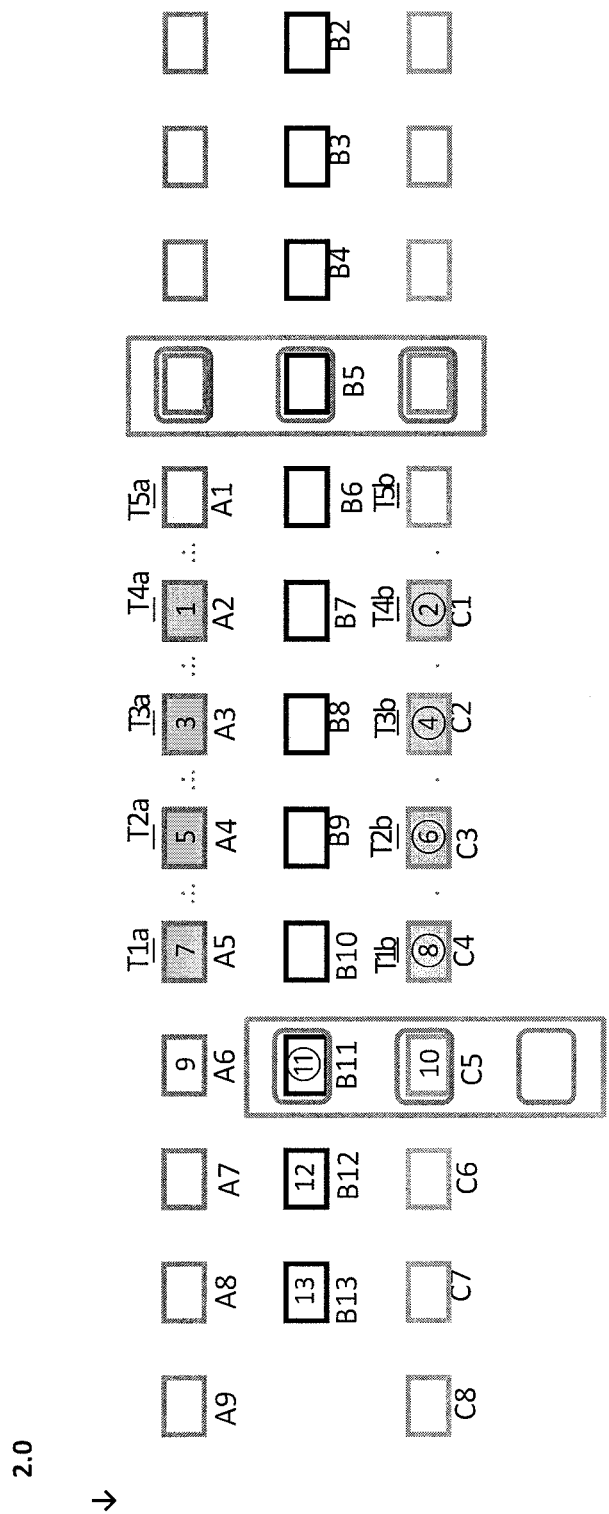
Figure 5W:
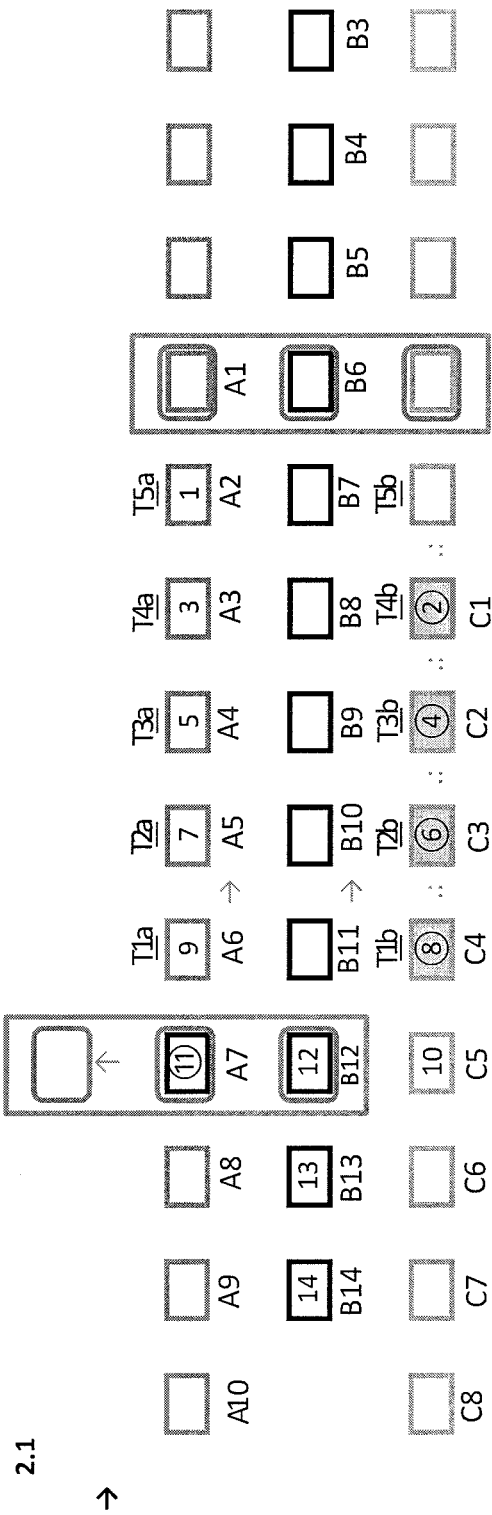
Figure 5X:
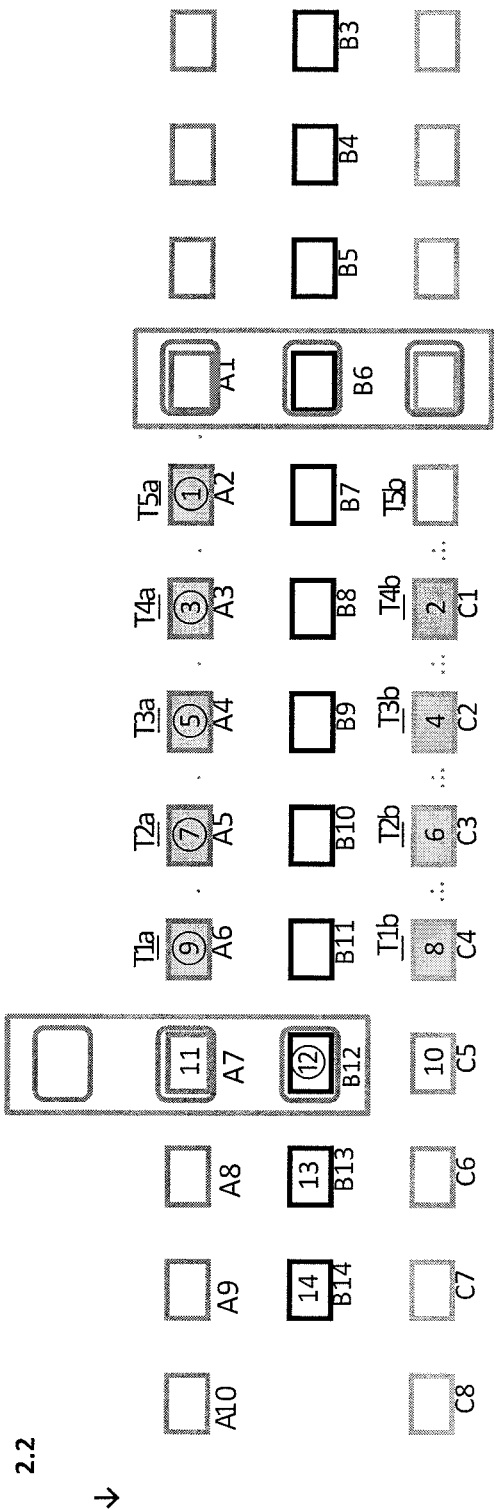
Figure 5Y:
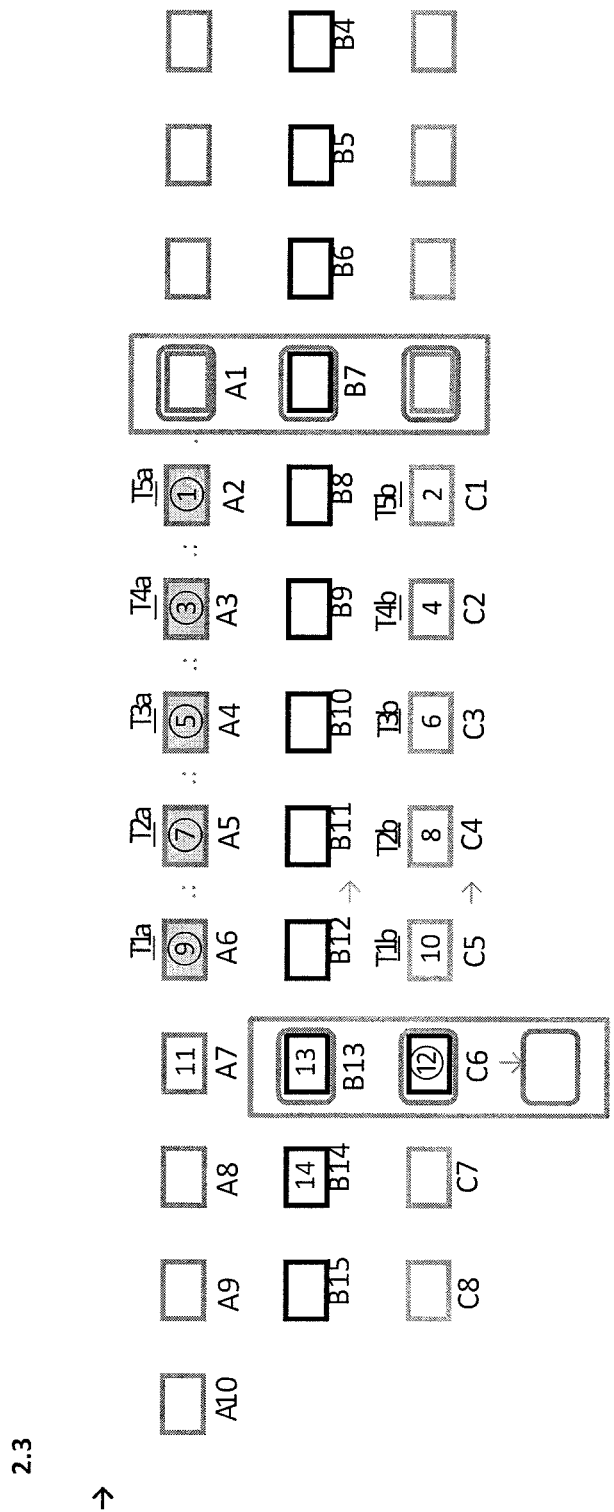
Figure 5Z:
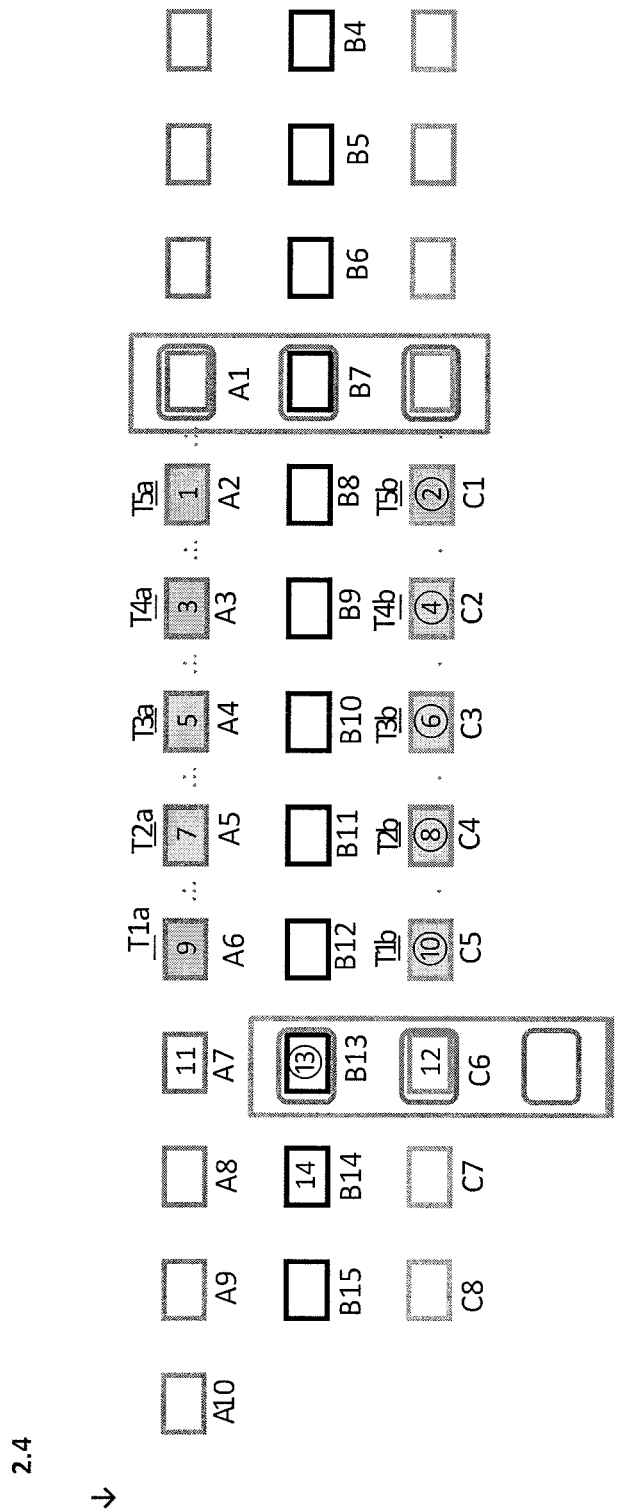
Figure 5A:
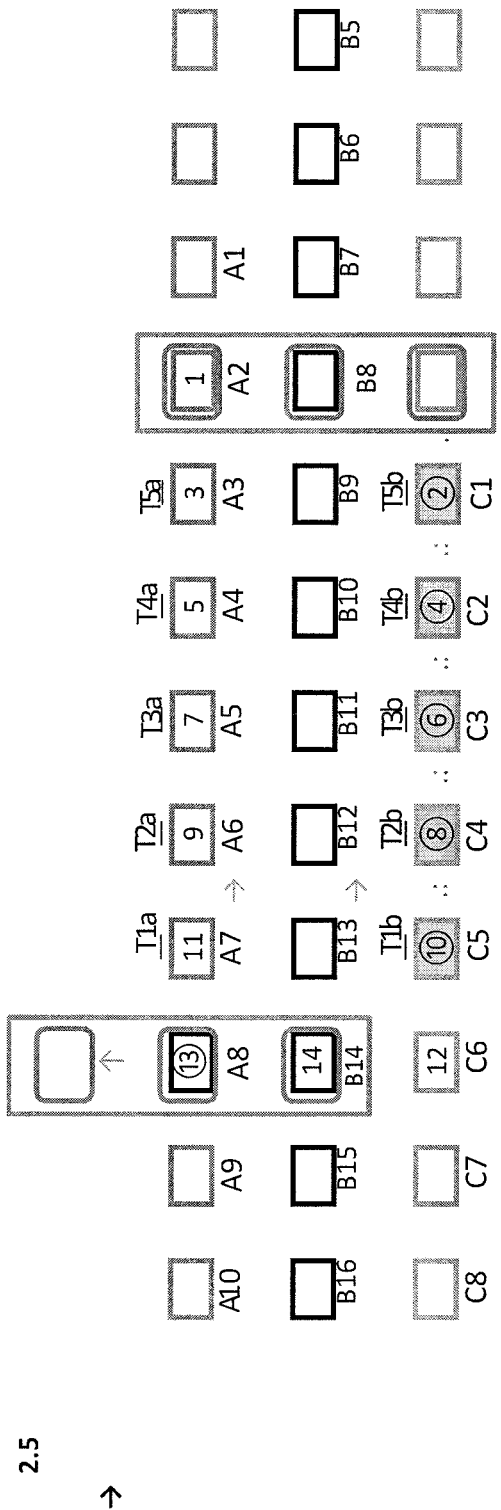
Figure 5A:
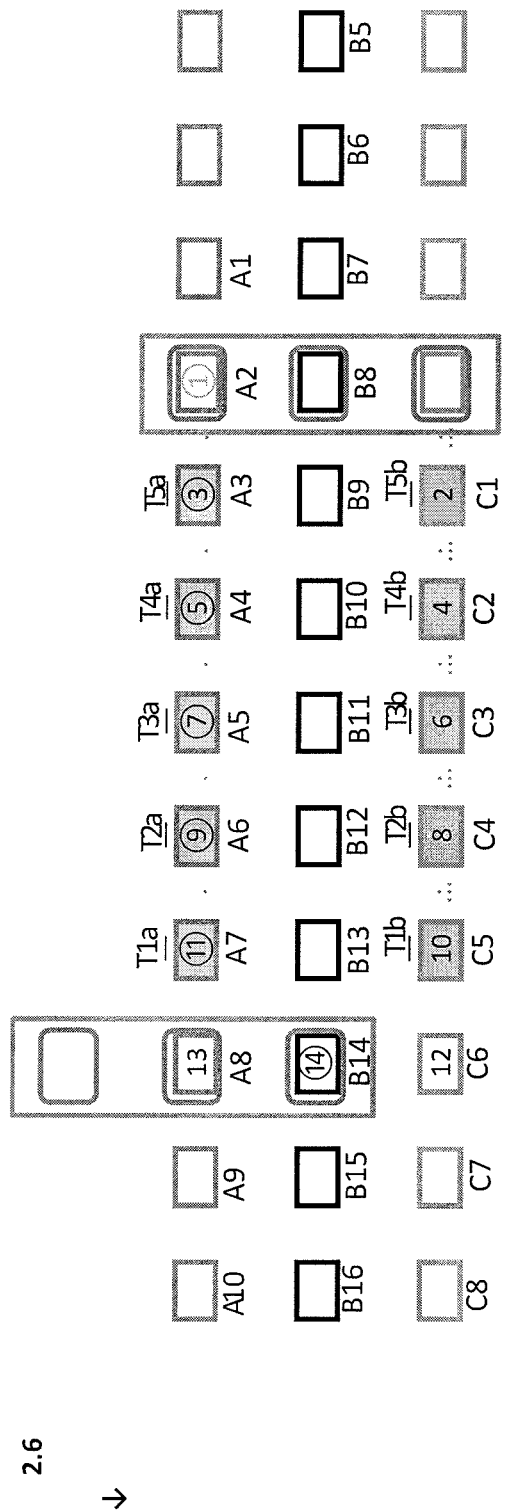
Figure 5A:
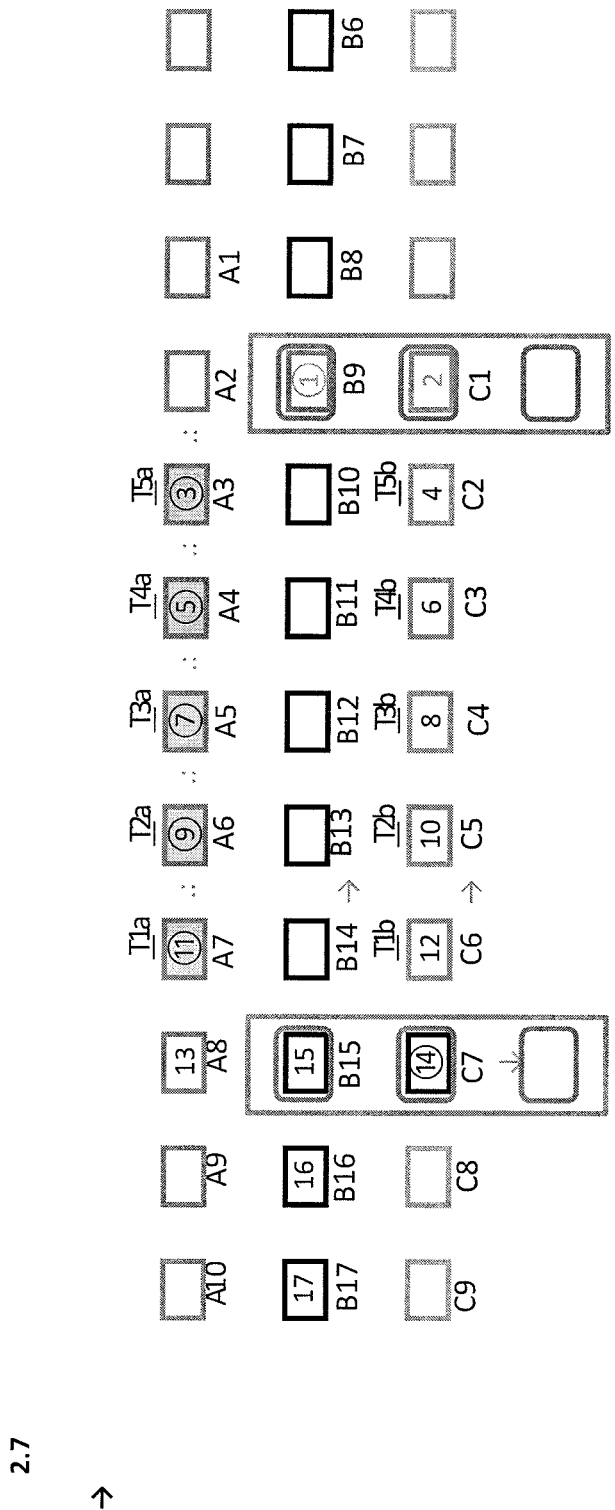
Figure 5A:
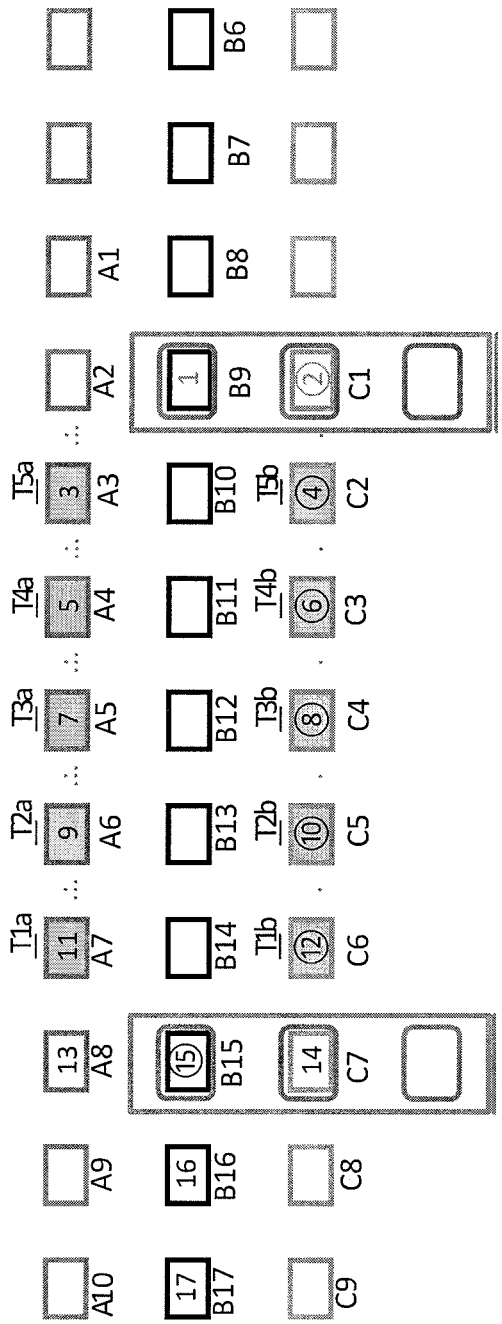
Figure 5A:
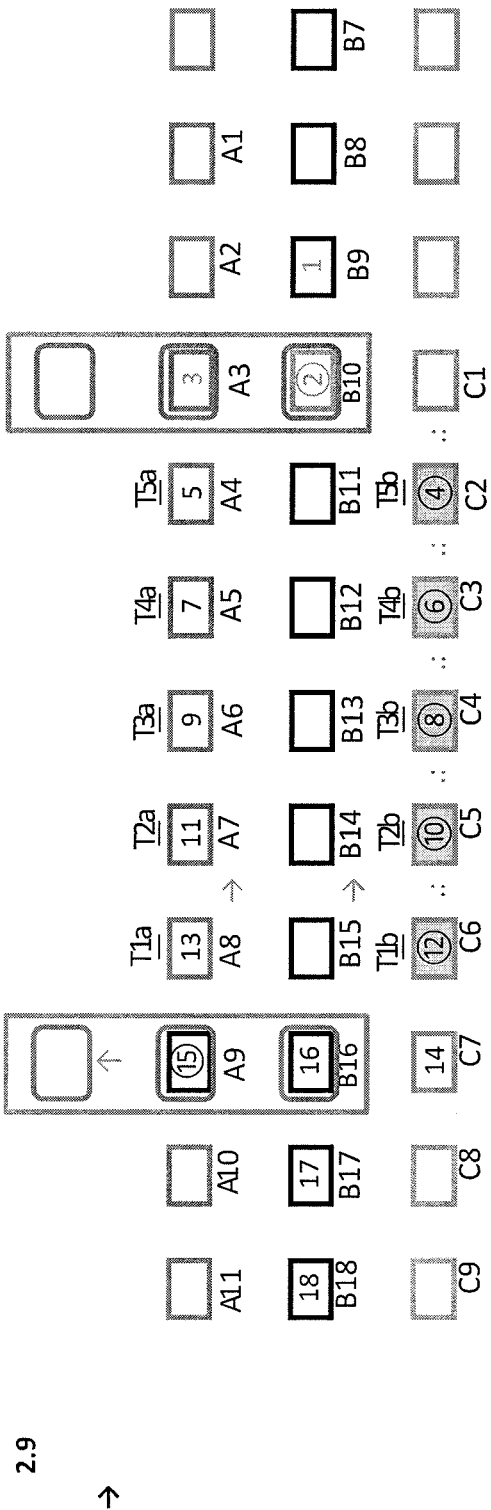
Figure 5A:
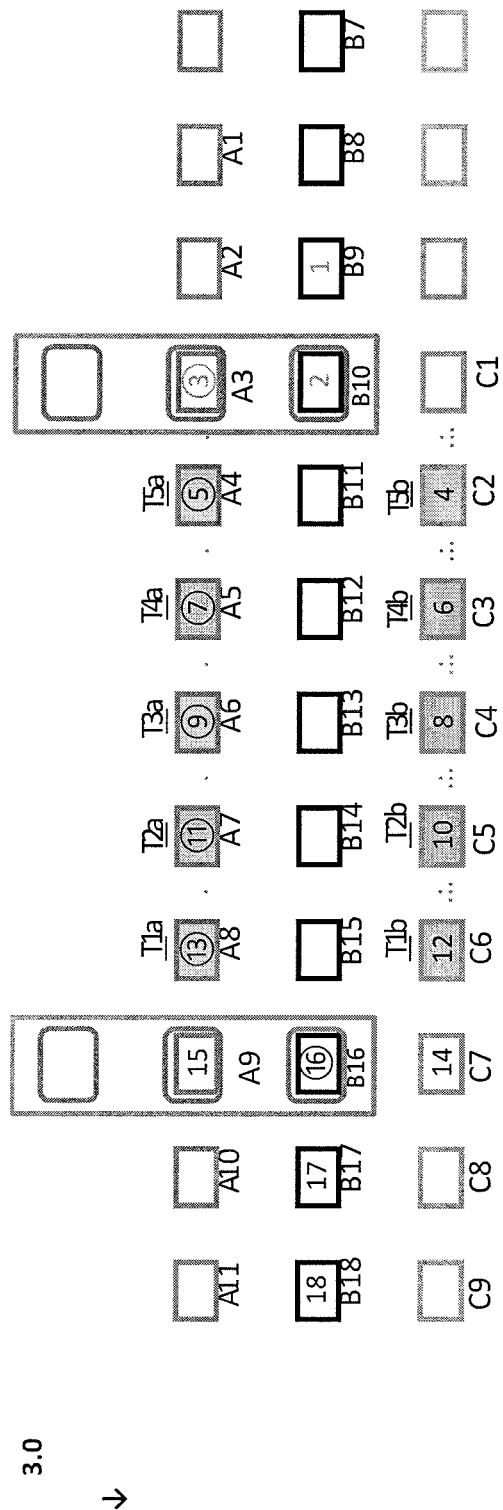
Figure 5A:
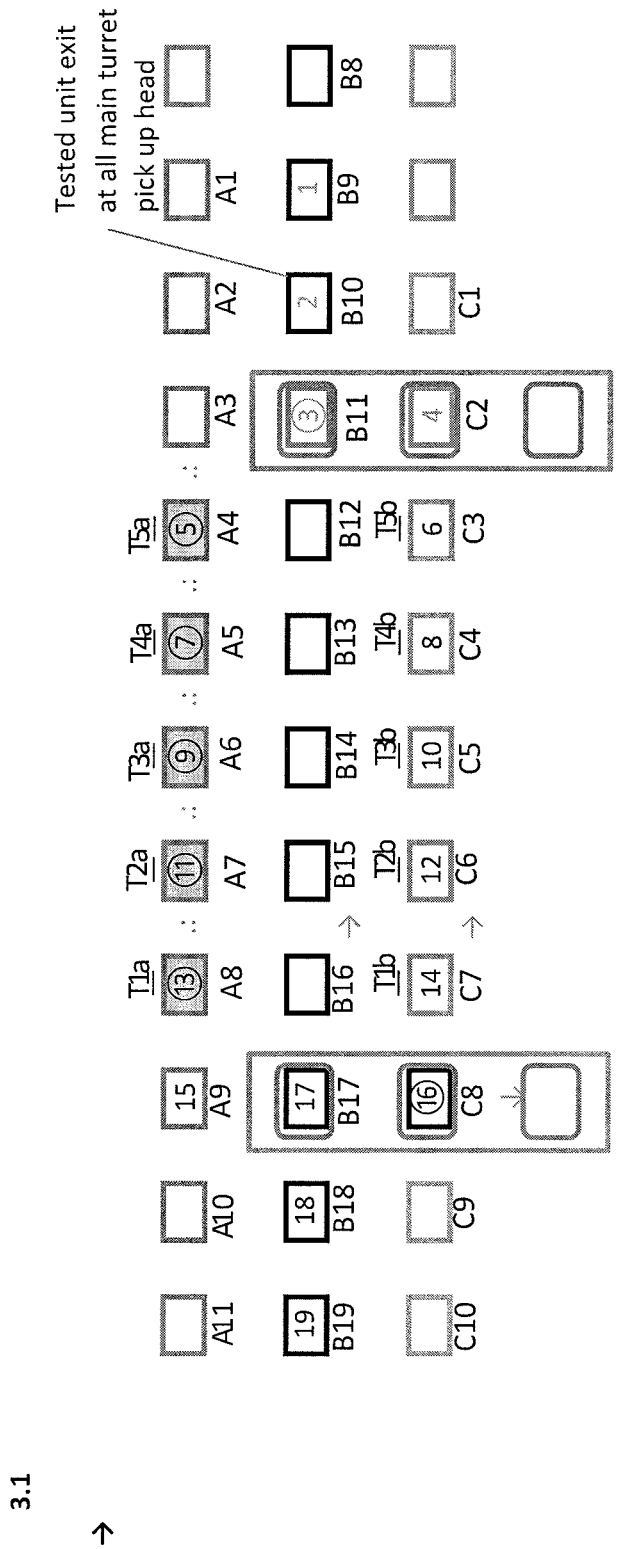
Figure 5A:
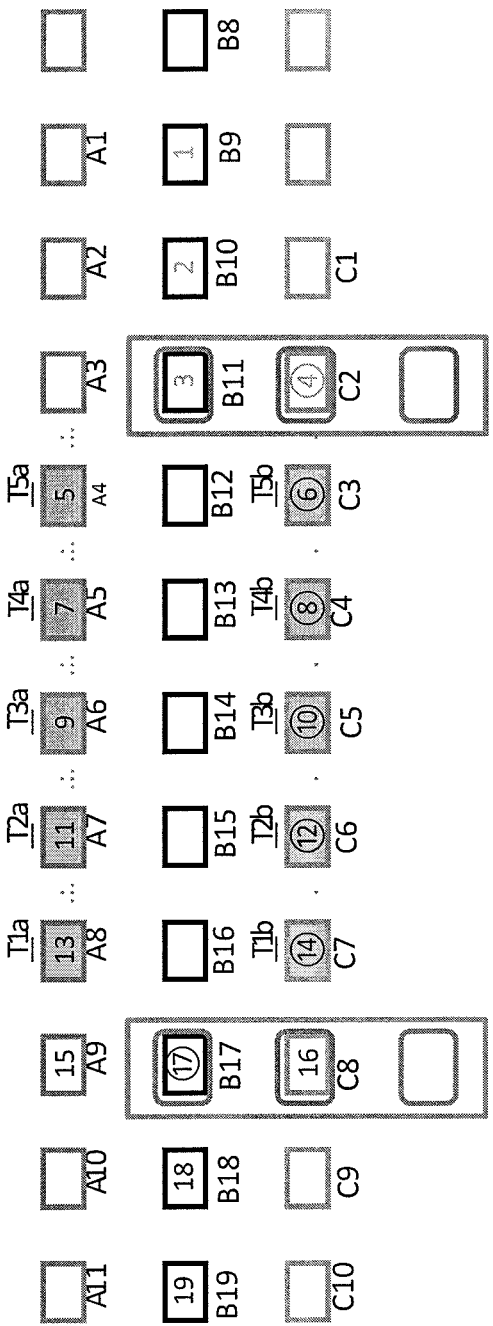

Similar processing continues as illustrated in FIGS. 5R-5AA. As next illustrated in FIG. 5AB, the first semiconductor component 1 is placed onto the merging stage 250. Referring to FIG. 5AC, the outer turret 130 is rotated so as to bring the second semiconductor component 2 under the merging stage 250. The merging stage 250 is moved so as to move the first semiconductor component 1 under the ninth pick up head B9 of the main turret 120.

Referring next to FIG. 5AD, the first semiconductor component 1 is picked up by the ninth pick up head B9 of the main turret 120 while the second semiconductor component 2 is placed onto the merging stage 250.

As illustrated in FIG. 5AE, the first semiconductor component 1 is moved due to a rotational movement of the main turret 130. Further, the merging stage 250 is moved laterally so as to align the second semiconductor component 2 under the main turret 130. As next illustrated in FIG. 5AF, the second semiconductor component 2 is picked up by the tenth pick up head B10 of the main turret 120 while the third semiconductor component 3 is placed onto the merging shuttle 250. Similarly, FIGS. 5AG and 5AH show the merging of the third semiconductor component 3 back onto the main turret 120.

Figure 6:
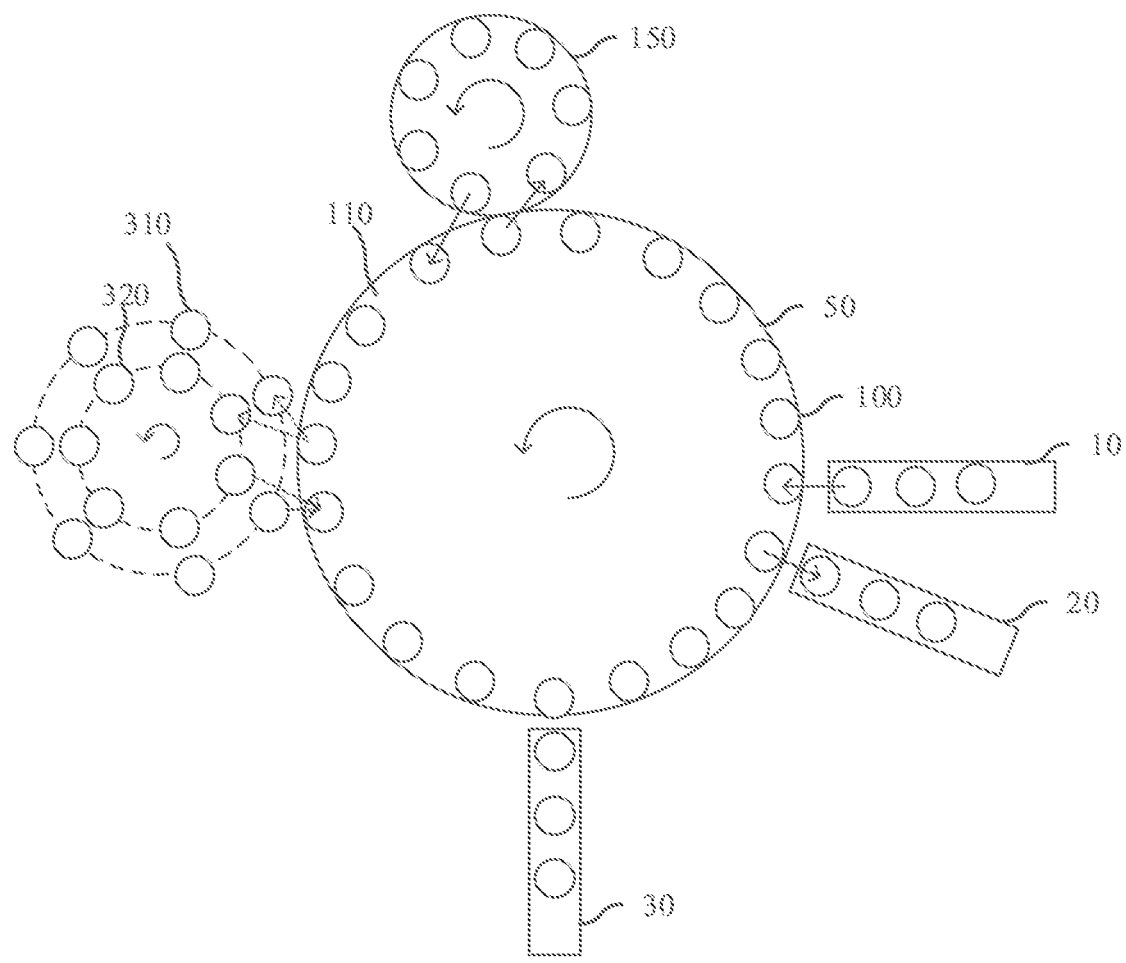
FIG. 6 illustrates a turret handler comprising a plurality of independent turrets in accordance with an alternative embodiment of the present invention.

FIG. 6 illustrates a turret handler comprising a plurality of independent turrets in accordance with an alternative embodiment of the present invention.

In this embodiment, the main turret 120 is disposed on a main station area while the additional turrets are disposed on a secondary station area. For example, a first turret 310 and a second turret 320 may be attached to the main station area as illustrated in FIG. 6. In various embodiments, a splitting stage may alternatively shuttle the semiconductor components into the first turret 310 and a second turret 320. Thus, the semiconductor components in the first turret 310 and a second turret 320 may be tested alternatively as described in FIG. 5. After the testing, the semiconductor components in the first turret 310 and a second turret 320 are merged back into the main turret 120 as illustrated by the arrows, for example, using a merging stage.

Figure 7:
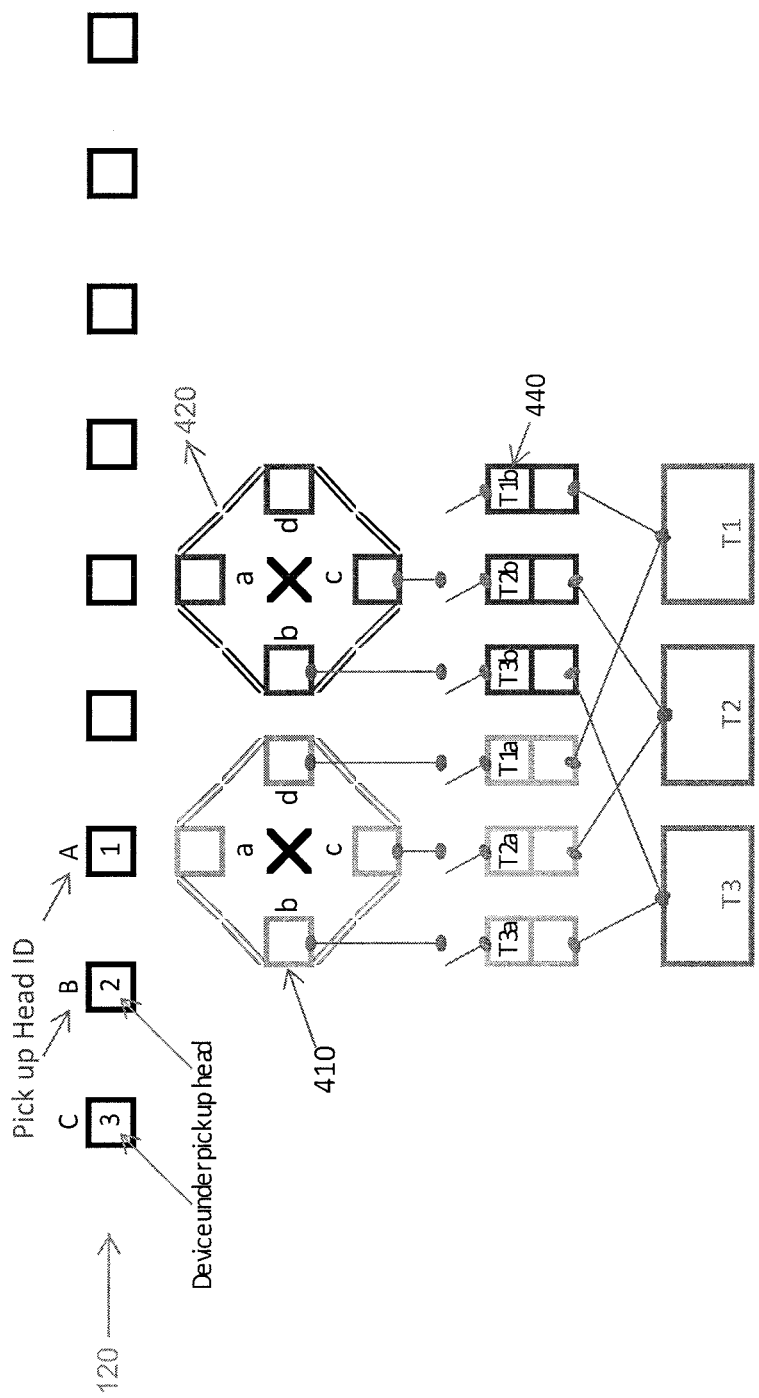
FIG. 7 illustrates a magnified illustration of the test station area of a turret handler comprising a plurality of turn tables in accordance with an alternative embodiment of the present invention.

FIG. 7 illustrates a magnified view of a turret handler comprising a plurality of turn tables in accordance with an alternative embodiment of the present invention.

In an alternative embodiment, the first turret 310 and the second turret 320 may be a table with test sockets. For example, each location on the first turret 310 may include a test pad or test socket connected to a test station. As in the prior embodiment, a single test station may be coupled to a test pad on the first turret 310 and a test pad on the second turret 320. As in prior embodiments, the semiconductor component may be tested at the test pad on the first turret 310 while another semiconductor component is loaded onto the test pad on the second turret 320.

In this embodiment, the plurality of additional tables with test sockets is attached proximate to the main turret 120. As illustrated in FIG. 7, a first table 410 and a second table 420 are disposed next to the main turret 120. The semiconductor components that are being transported through the main turret 120 are alternatively transported into the first table 410 and the second table 420. Each of the first table 410 and the second table 420 has a plurality of test sockets 430 or test pads. Each test socket is coupled to a test clamp of a plurality of test clamps 440. As in prior embodiments, the first test clamps (T1a, T2a, and T3a) supporting the test sockets of the first table 410 are coupled in parallel with the second test clamps (T1b, T2b, and T3b) supporting the test sockets of the second table 420. As further illustrated, the plurality of test clamps 440 comprising the first and the second test clamps is coupled to the test stations (T1, T2, T3).

Figure 8A:
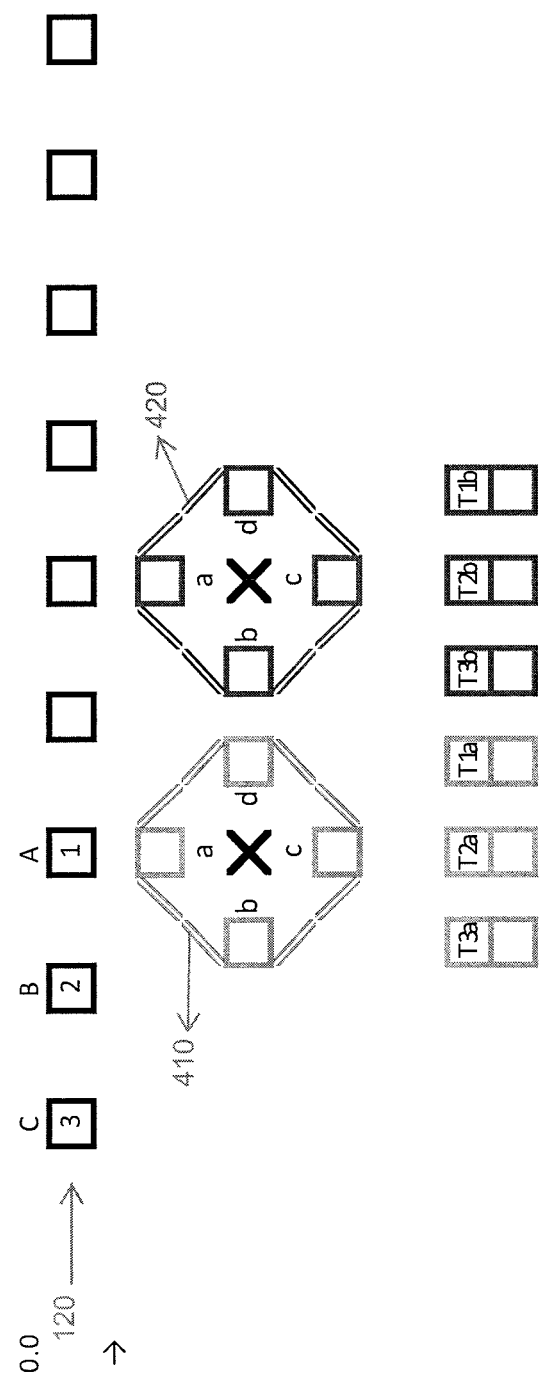
FIGS. 8A-8U, illustrates a magnified illustration of the test station area of a turret handler during processing in accordance with an embodiment of the invention.
Figure 8B:
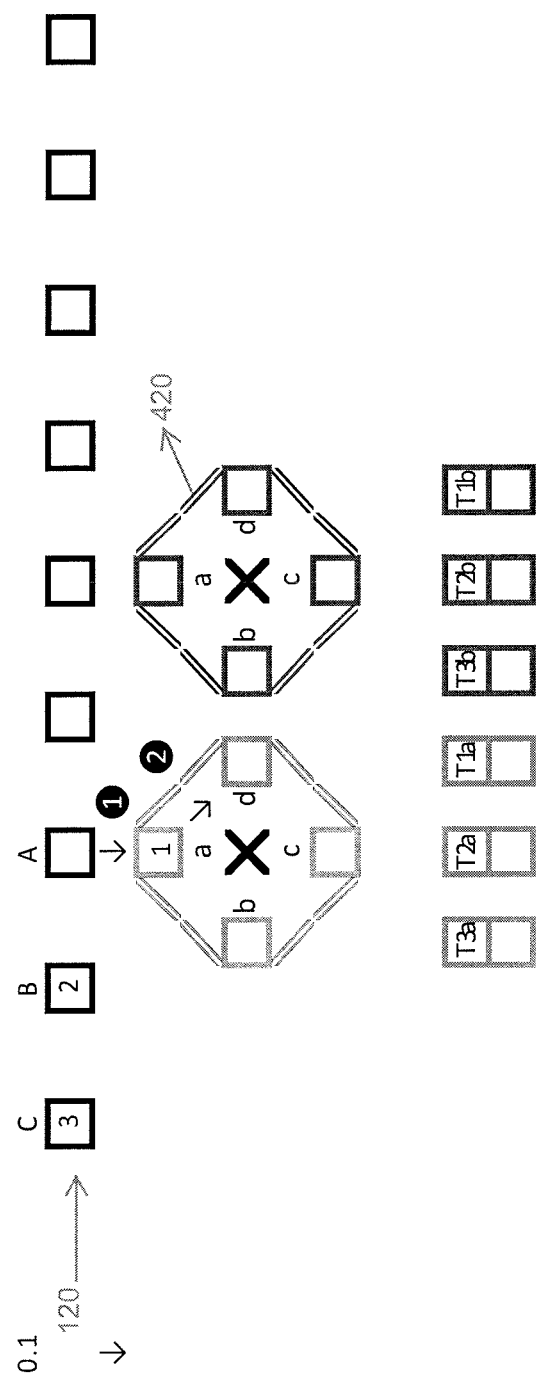
FIG. 8, which includes
Figure 8C:
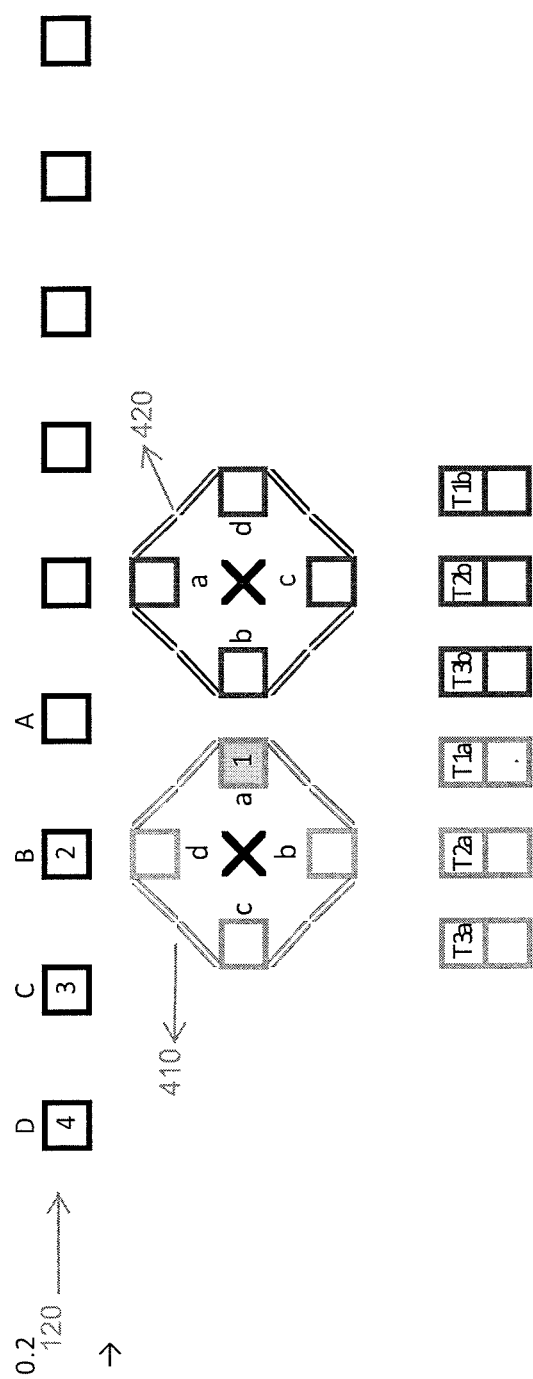
Figure 8D:
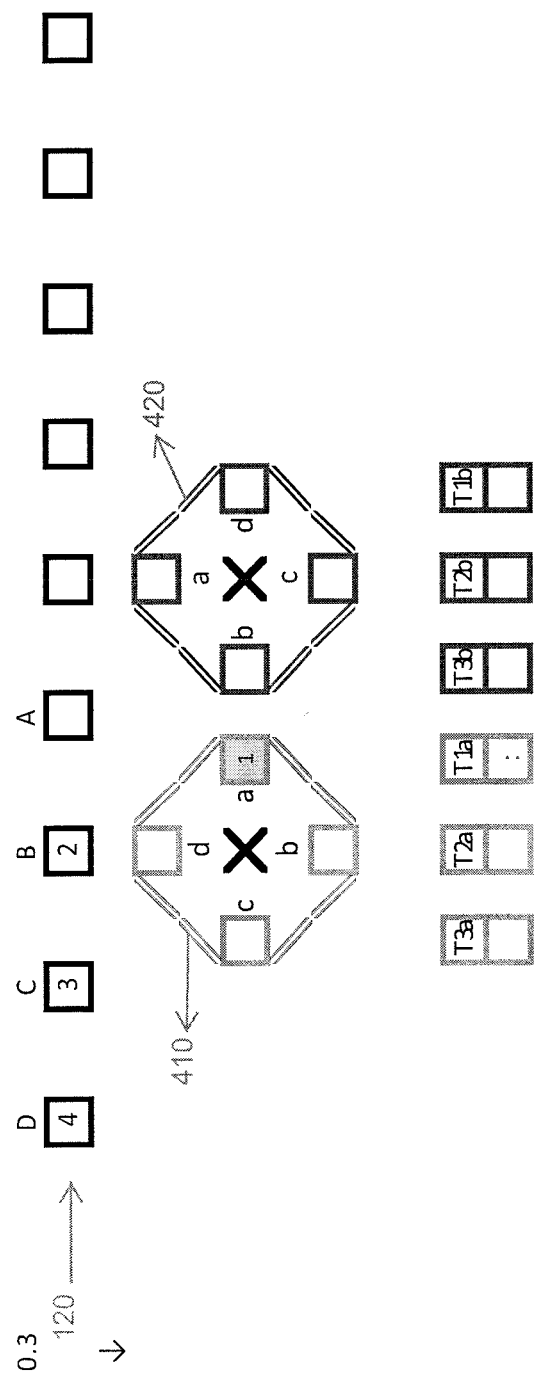
Figure 8E:
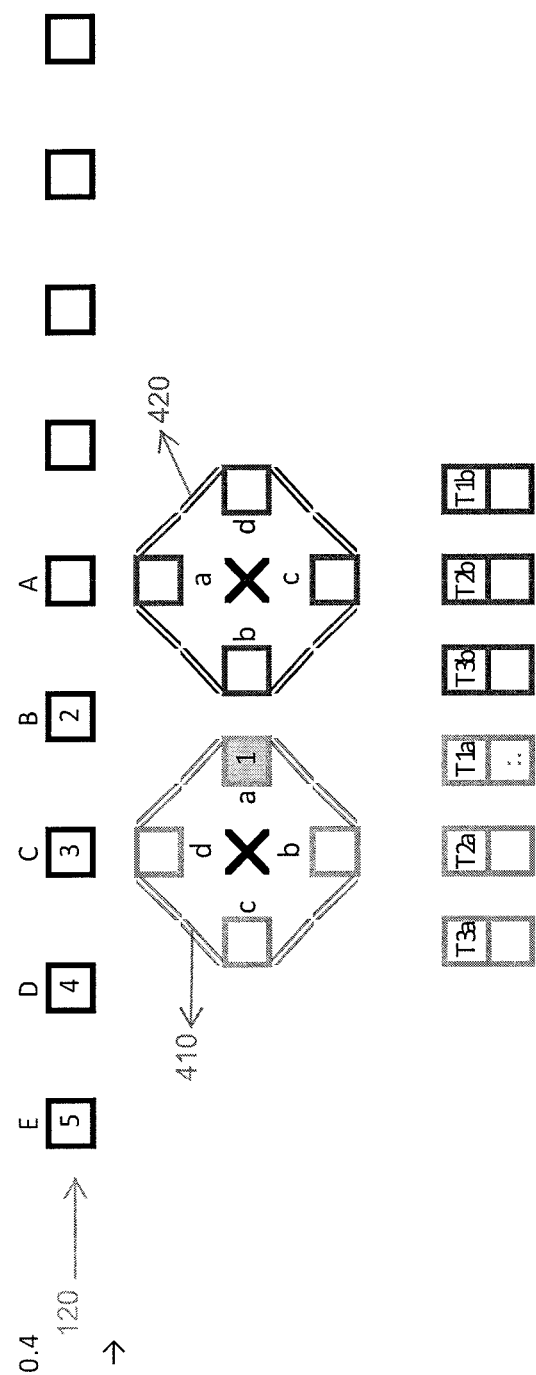
Figure 8F:
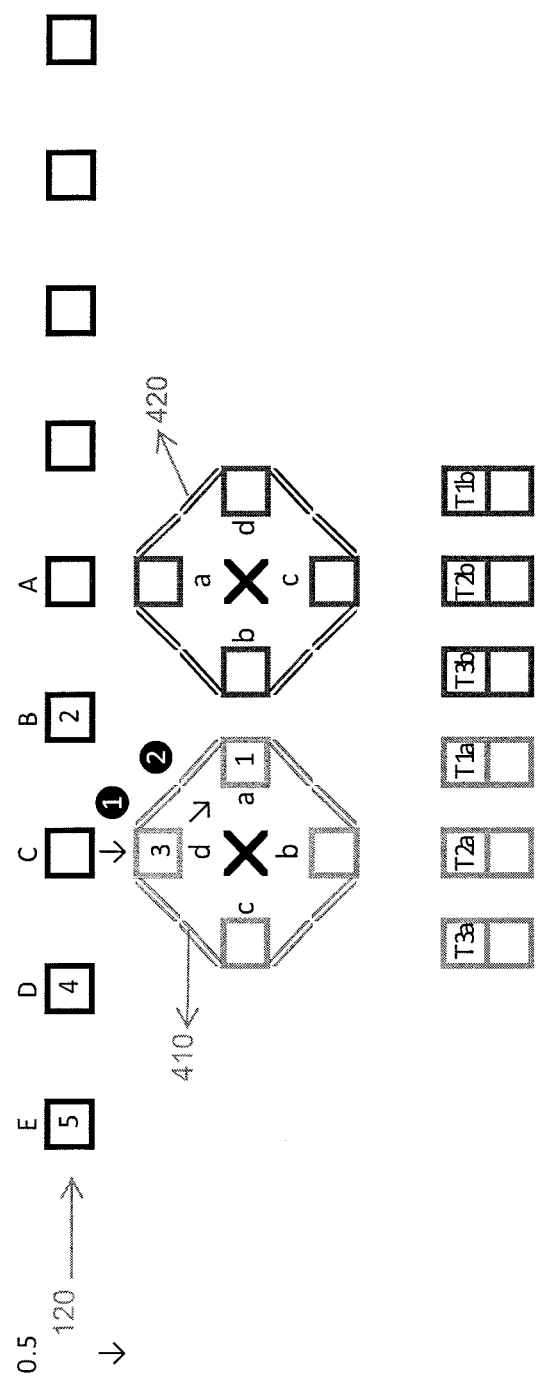
Figure 8G:
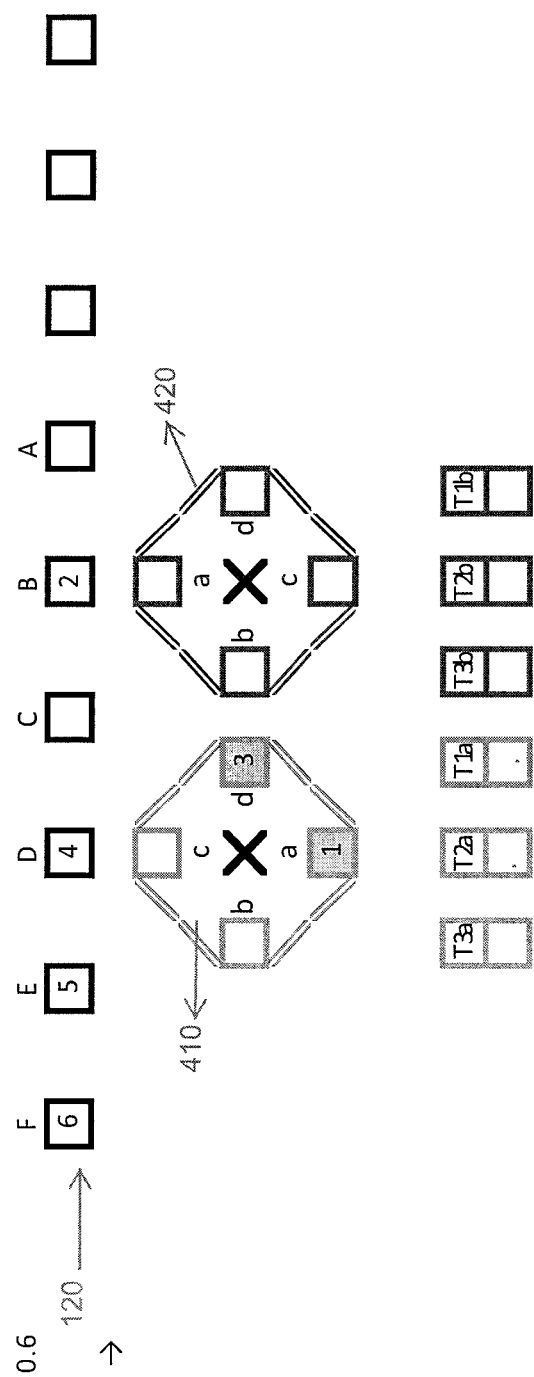
Figure 8H:
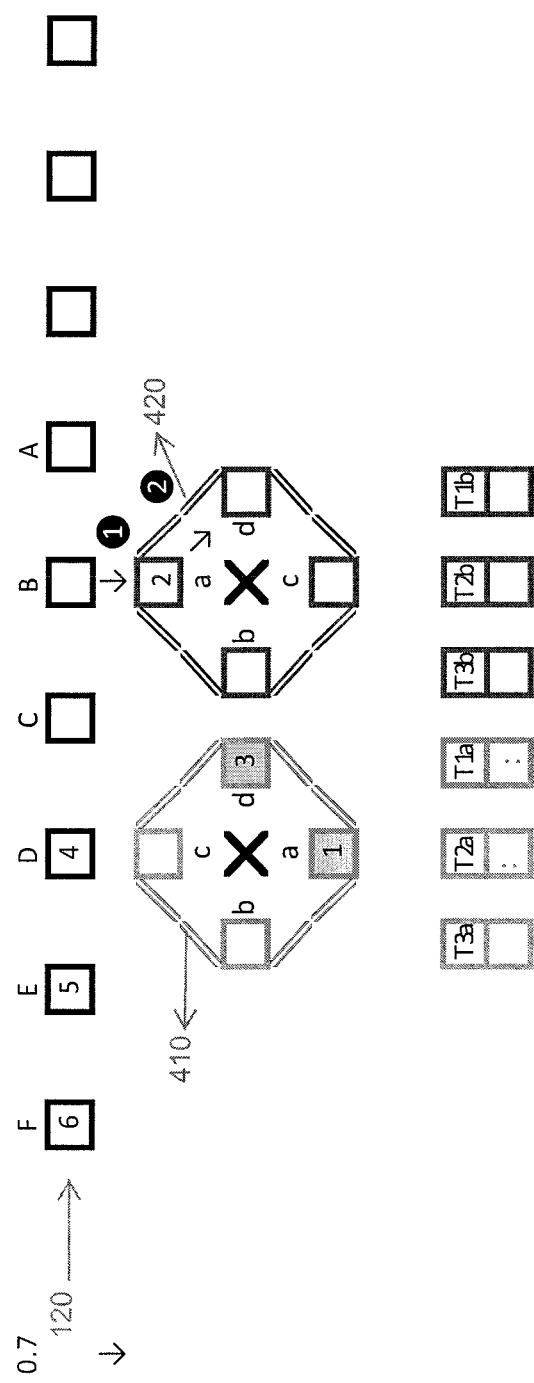
Figure 8I:
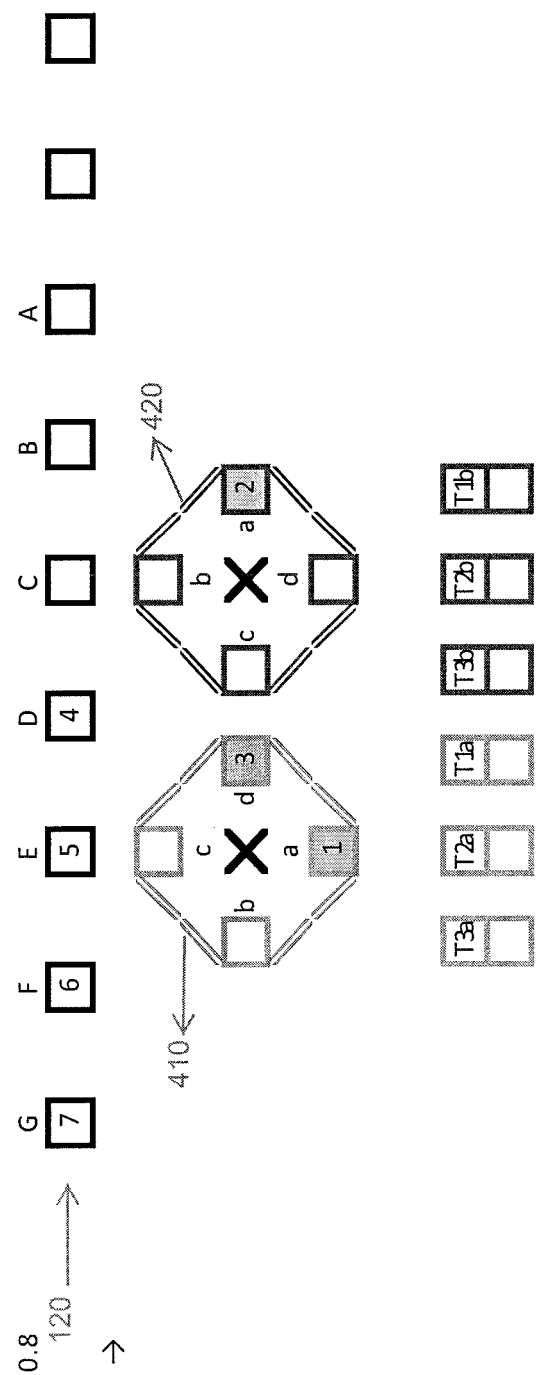
Figure 8J:
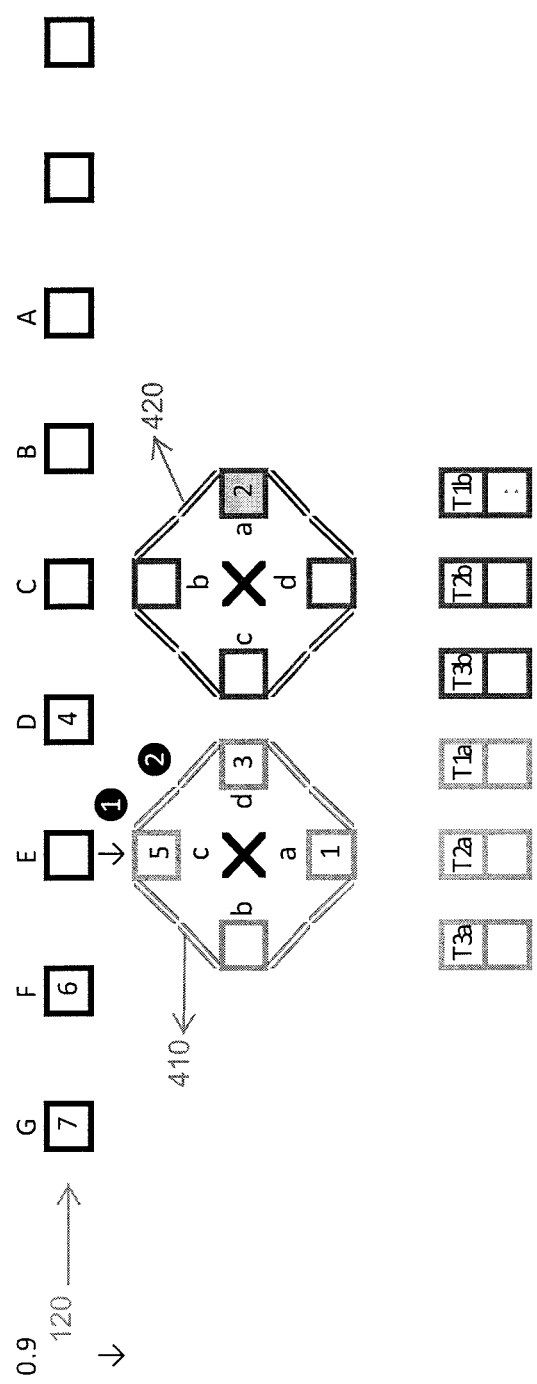
Figure 8K:
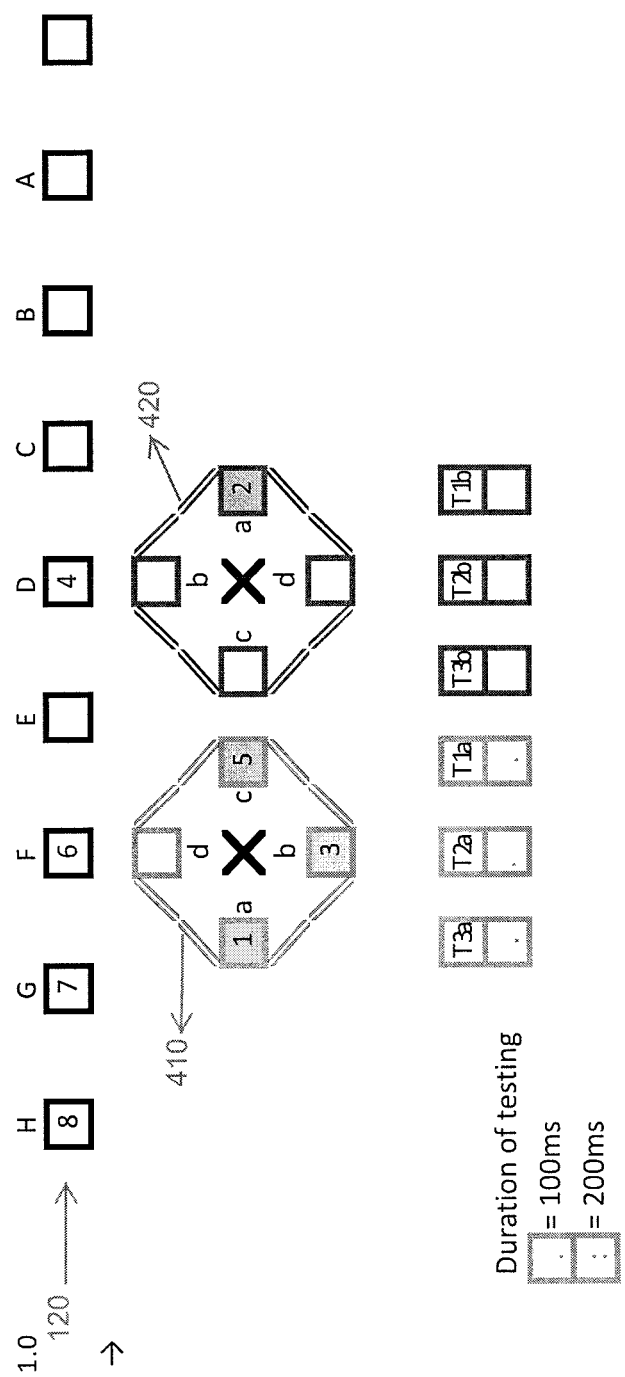
Figure 8M:
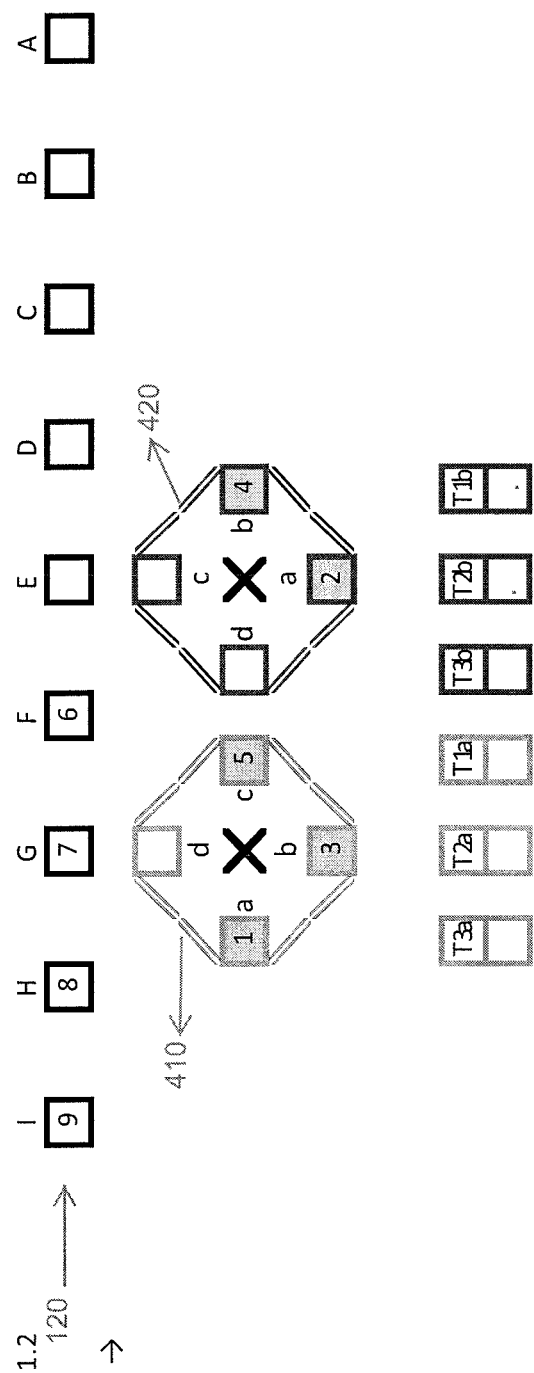
Figure 8N:
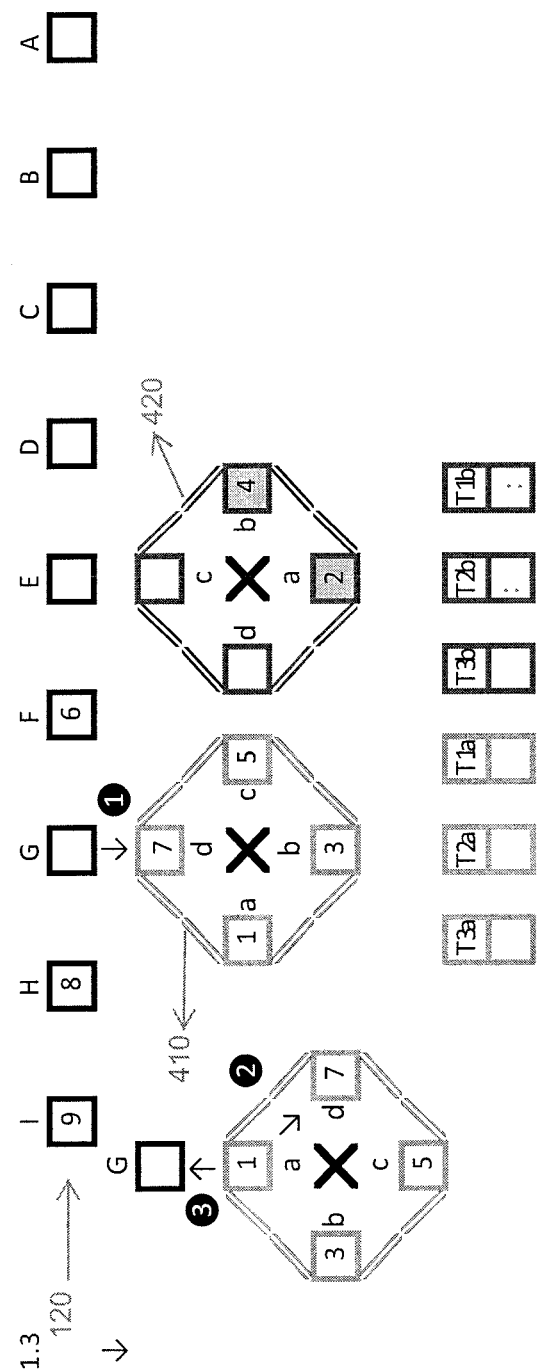
Figure 8O:
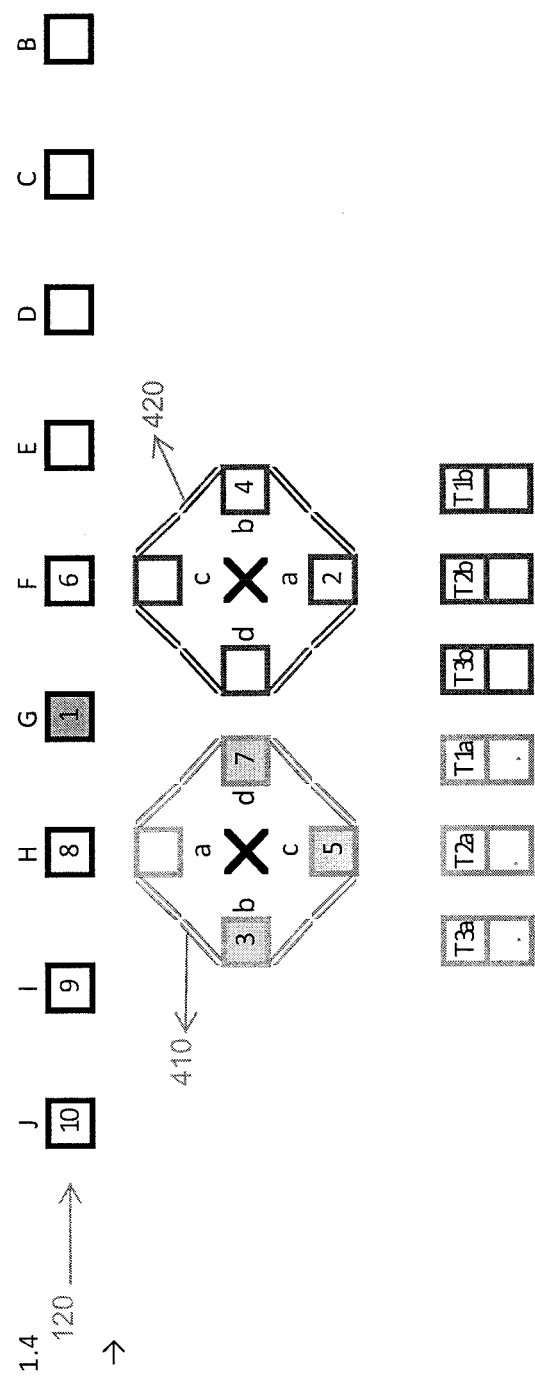
Figure 8P:
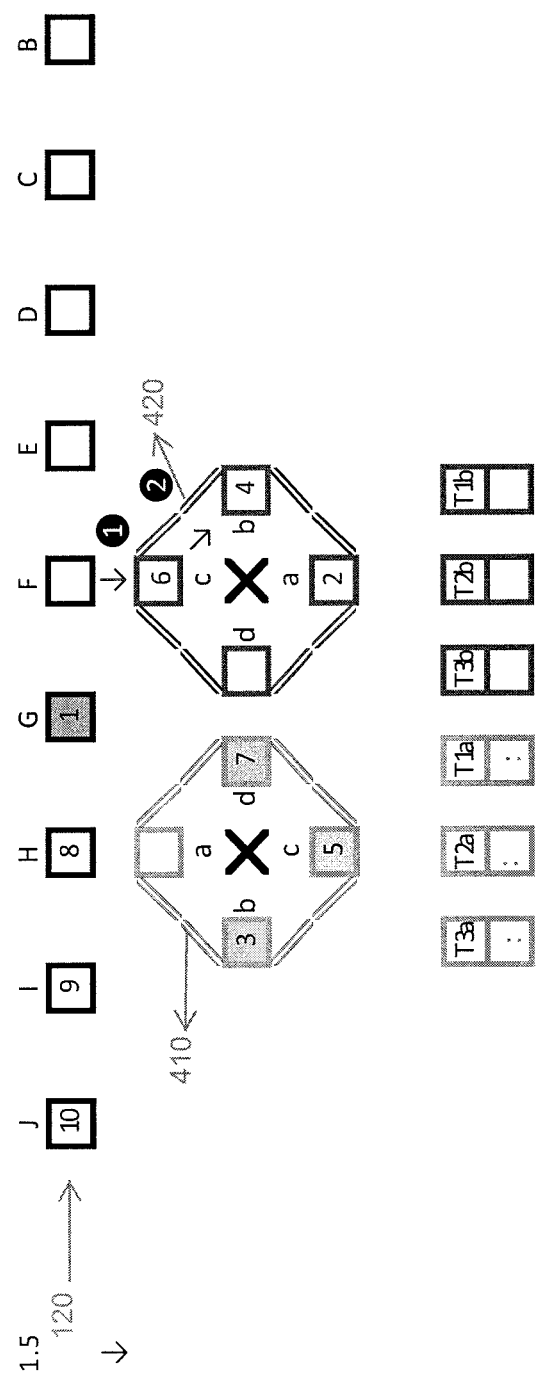
Figure 8Q:
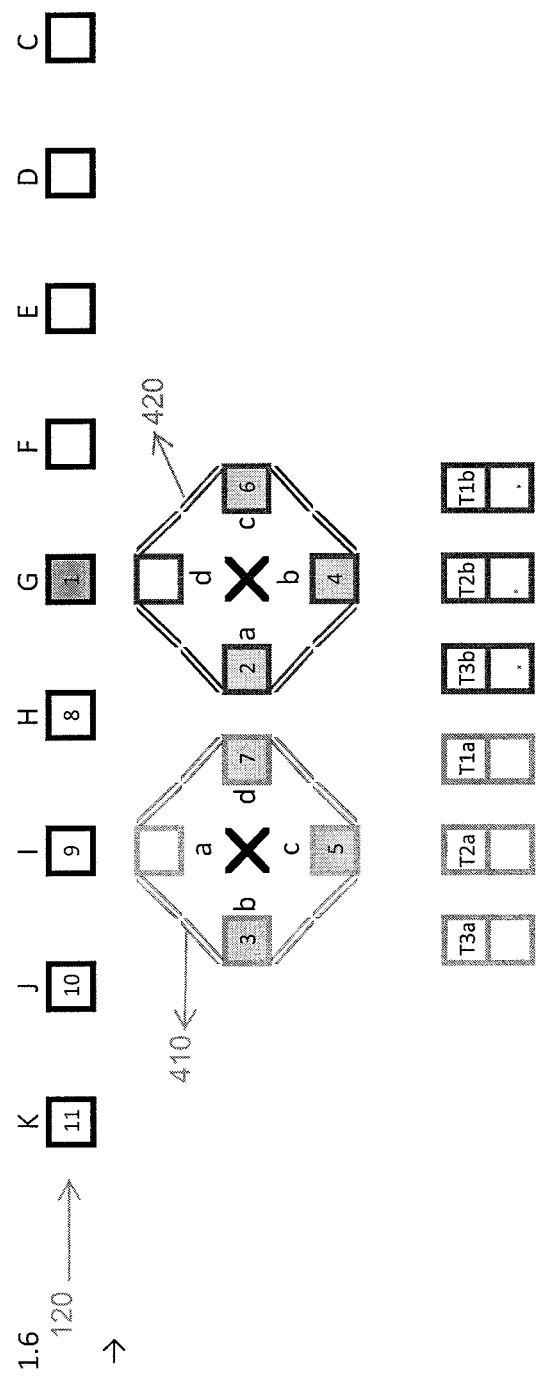
Figure 8R:
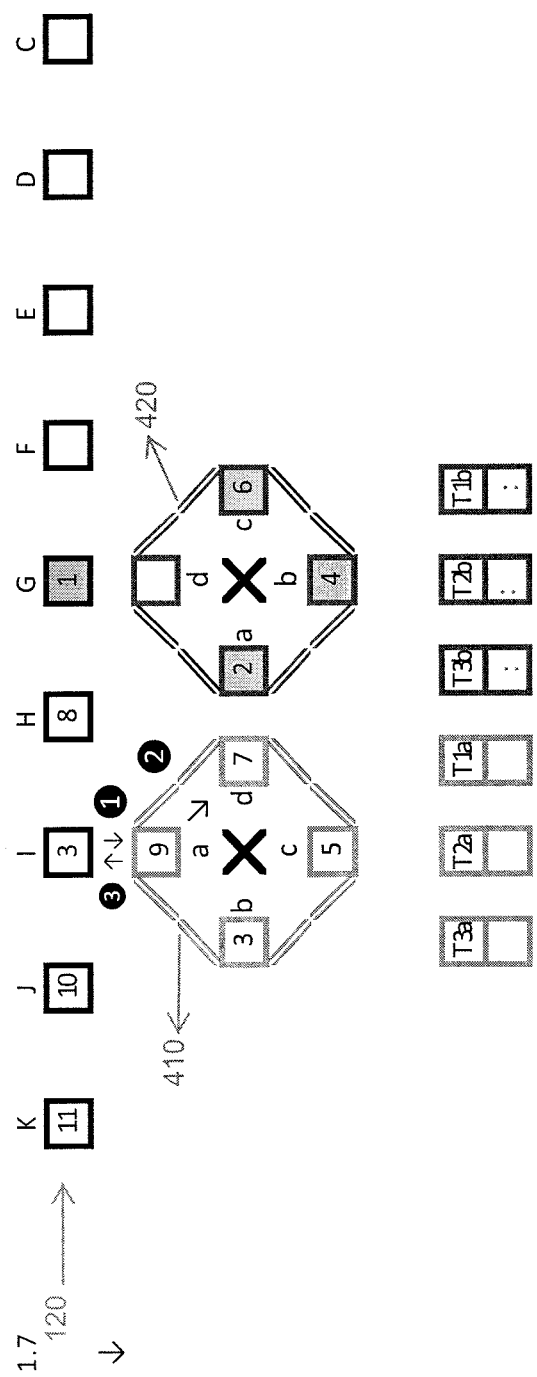
Figure 8S:
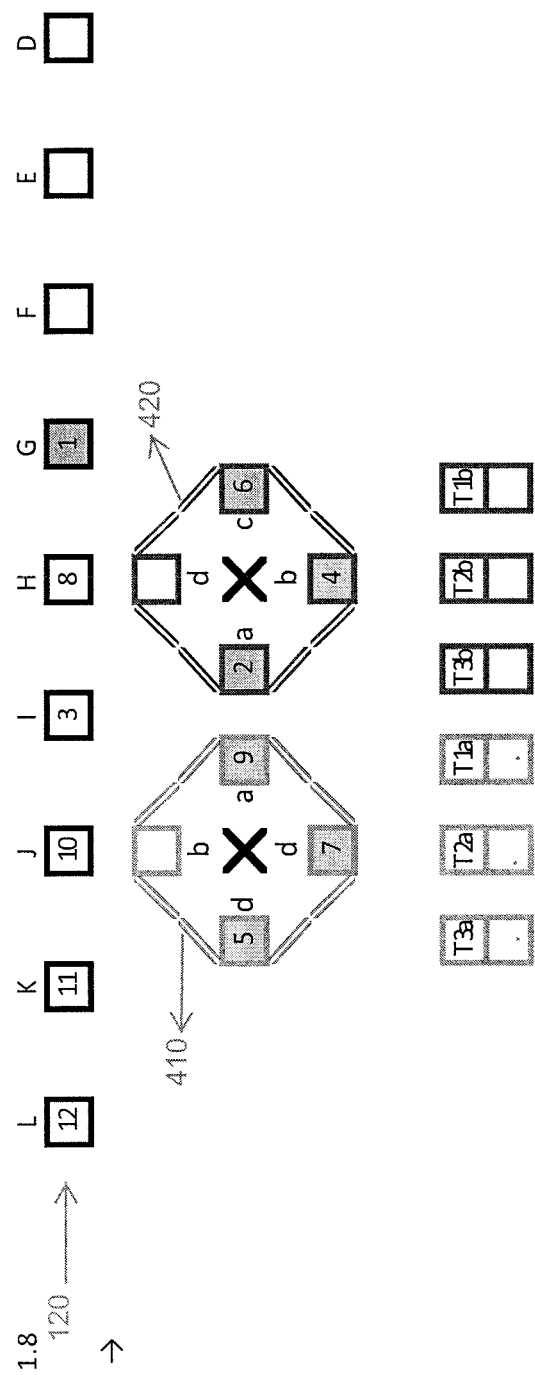
Figure 8T:
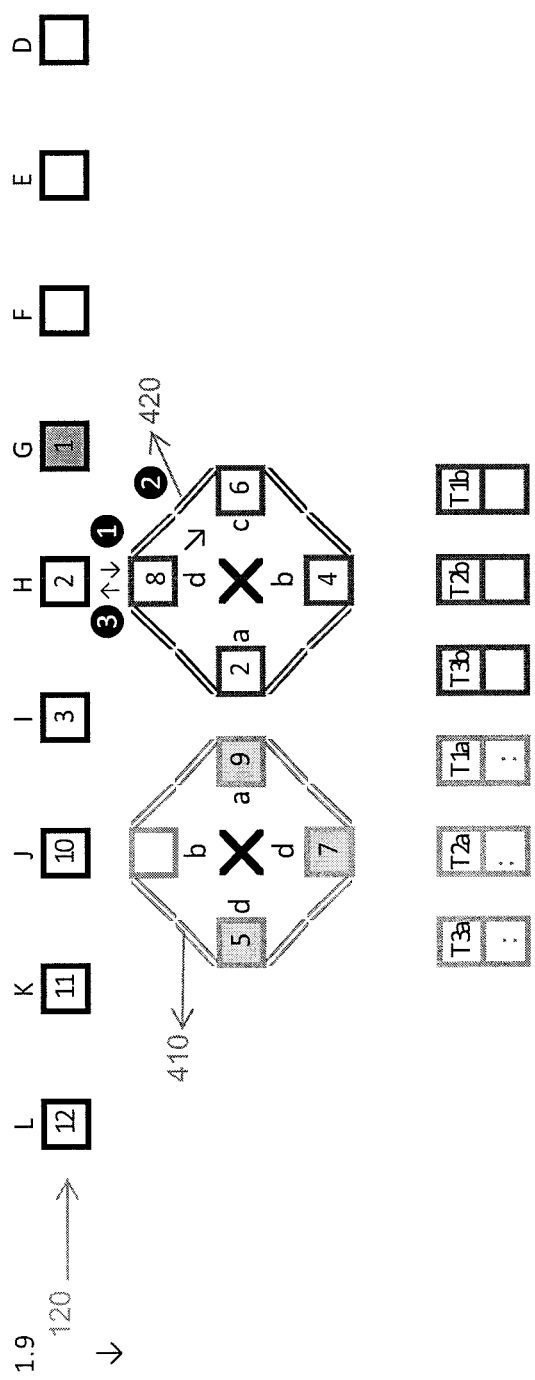
Figure 8U:
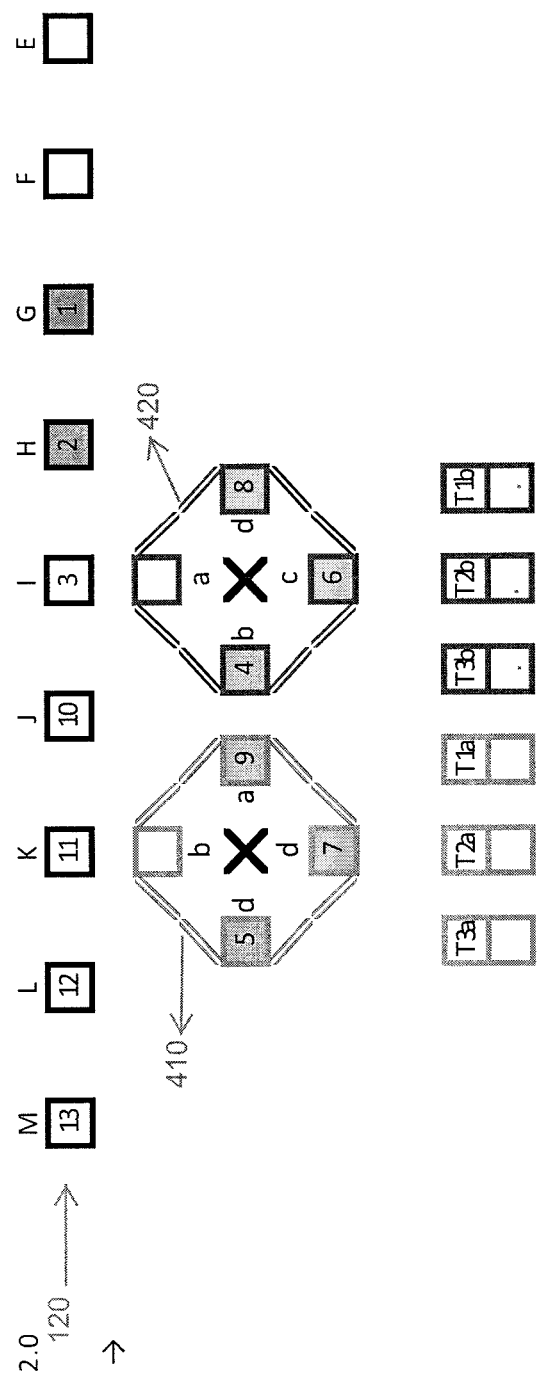

FIG. 8, which includes FIGS. 8A-8U, illustrates a turret handler during processing in accordance with an embodiment of the invention. FIG. 8 illustrates the turret handling after each process step used in the embodiments of FIG. 7.

Referring to FIG. 8A, the first semiconductor component 1 is transported using pickup head A of the main turret 120. As next illustrated in FIG. 8B, the first semiconductor component 1 is transferred to a first location "a" on the first table 410. As illustrated next in FIG. 8C, the main turret 120 is rotated around a vertical axis. In parallel, the first table 410 is also rotated around another vertical axis at the center of the first table 410 thereby transporting the first semiconductor component 1. As illustrated in FIG. 7, the test claim T1a may be activated to start testing the first semiconductor component 1 (FIG. 8D).

Referring to FIG. 8E, the main turret 120 is rotated to bring the third semiconductor component 3 in a position next to the first table 410. As next illustrated in FIG. 8F, the third semiconductor component 3 is transported to a fourth location "d" on the first table 410. Next, in FIG. 8G, the first table 410 and the main turret 120 are rotated bringing the second semiconductor component 2 in a position next to the second table 420. The rotation of the first table 410 changes the first semiconductor component 1 to the next test clamp T2a.

Referring to FIG. 8H, a second semiconductor component 2 is transported to a first position "a" at the second table 420. In FIG. 8I, the second table 420 is rotated while the semiconductor components in the first table 410 undergo testing. In parallel, the main turret 120 is also rotated. Referring next to FIG. 8J, testing of the first semiconductor component 1 and the third semiconductor component 3 is stopped while the testing of the second semiconductor component 2 begins. At the same time the fifth semiconductor component 5 is transported to the first table 410.

As next illustrated in FIG. 8K, the first table 410 and the main turret 120 are rotated. In FIG. 8L, the first semiconductor component 1, the third semiconductor component 3, and a fifth semiconductor equipment 5 begin testing. In parallel, the fourth semiconductor component 4 is transported to the second table 420 at a second position "b".

As illustrated next in FIG. 8M, the main turret 120 and the second table 420 are rotated. In FIG. 8N, the second semiconductor component 2 and the fourth semiconductor component 4 begin testing while the seventh semiconductor component 7 is transported to the fourth location "d" on the first table 410.

Next, the first table 410 protects aligning the first semiconductor component 1 with the pickup head G on the main turret 120. This pickup head G picks up the first semiconductor component 1 from the first table 410. The main turret 120 rotates as further illustrated in FIG. 8O. Subsequent processing continues as illustrated in FIGS. 8P-8U. As illustrated in FIG. 8U, the semiconductor components are arranged in the same order in which they originally entered the plurality of tables for testing.

As in prior embodiments, the frequency of the rotation of the first table 410 is similar to the frequency of the rotation of the second table 420, which is half the frequency of the location of the main turret 120. In alternative embodiments, as described earlier, the traditional frequency of the tables may be lowered further, e.g., ⅓ for three tables, ¼ for four tables, and so on.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-8 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing a semiconductor component, the method comprising:
   loading a plurality of semiconductor components into a main turret of a turret handler;
   transporting the plurality of semiconductor components using the main turret to a test area;
   splitting the plurality of semiconductor components into a first set and a second set, wherein splitting the plurality of semiconductor components into a first set and a second set comprises transporting the first set from the main turret to a first secondary turret and transporting the second set from the main turret to a second secondary turret, wherein the first secondary turret and the second secondary turret are configured to move independently, wherein the first secondary turret, the second secondary turret and the main turret share a common rotational axis;
   using a tester, testing a first semiconductor component in the first set at a first test pad while transporting a first semiconductor component in the second set to a second test pad;
   using the tester, testing the first semiconductor component while transporting the first semiconductor component in the first set out of the first test pad; and
   merging the first set and the second set and transporting the plurality of semiconductor components away from the test area using the main turret.

2. The method of claim 1, wherein merging the first set and the second set comprises transporting the first set from the first secondary turret to the main turret and transporting the second set from the second secondary turret to the main turret.

3. The method of claim 1, wherein the first secondary turret and the second secondary turret are disposed along the main turret on the turret handler.

4. The method of claim 1, wherein the first secondary turret and the second secondary turret are disposed in a separate substation area proximate the main turret.

5. A method of testing a semiconductor component, the method comprising:
   loading a plurality of semiconductor components into a main turret of a turret handler;
   transporting the plurality of semiconductor components using the main turret to a test area;
   splitting the plurality of semiconductor components into a first set and a second set, wherein splitting the plurality of semiconductor components into a first set and a second set comprises transporting the first set from the main turret to a first secondary table and transporting the second set from the main turret to a second secondary table, and wherein the first secondary table and the second secondary table are configured to rotate, wherein the first secondary table and the second secondary table are configured to move independently, wherein the first secondary table, the second secondary table and the main turret share a common rotational axis;
   using a tester, testing a first semiconductor component in the first set at a first test pad while transporting a first semiconductor component in the second set to a second test pad;
   using the tester, testing the first semiconductor component in the second set while transporting the first semiconductor component in the first set out of the first test pad; and
   merging the first set and the second set and transporting the plurality of semiconductor components away from the test area using the main turret.

6. The method of claim 5, wherein merging the first set and the second set comprises transporting the first set from the first secondary table to the main turret and transporting the second set from the second secondary table to the main turret.

7. The method of claim 5, wherein the first secondary table and the second secondary table comprise a plurality of sockets.

8. The method of claim 5, wherein the first secondary table and the second secondary table are separate tables.

9. A method of testing a semiconductor component, the method comprising:
   loading a plurality of semiconductor components into a main turret of a turret handler;
   transporting the plurality of semiconductor components using the main turret to a test area;
   splitting the plurality of semiconductor components into a first set and a second set, wherein splitting the plurality of semiconductor components into a first set and a second set comprises transporting the first set from the main turret to a first secondary turret and transporting the second set from the main turret to a second secondary turret, wherein the first secondary turret is configured to move out of phase with the second secondary turret, wherein a phase difference between a movement of the first secondary turret and a movement of the second secondary turret is constant;
   using a tester, testing a first semiconductor component in the first set at a first test pad while transporting a first semiconductor component in the second set to a second test pad;

using the tester, testing the first semiconductor component in the second set while transporting the first semiconductor component in the first set out of the first test pad; and merging the first set and the second set and transporting the plurality of semiconductor components away from the test area using the main turret.

10. The method of claim 9, wherein transporting the first semiconductor component in the second set to a second test pad comprises moving the second secondary turret down to the second test pad, wherein when the second secondary turret is moving the first semiconductor component of the second set to the second test pad, the first secondary turret is moving the first semiconductor component of the first set out of the first test pad.

11. The method of claim 9, wherein merging the first set and the second set comprises transporting the first set from the first secondary turret to the main turret and transporting the second set from the second secondary turret to the main turret.

12. The method of claim 9, wherein the first secondary turret and the second secondary turret are disposed along the main turret on the turret handler.

13. The method of claim 9, wherein the first secondary turret, the second secondary turret, and the main turret share a common rotational axis.

14. The method of claim 9, wherein the first secondary turret and the second secondary turret are disposed in a separate substation area proximate the main turret.

* * * * *

UNITED STATES PATENT AND TRADEMARK OFFICE
CERTIFICATE OF CORRECTION

PATENT NO. : 9,594,111 B2  
APPLICATION NO. : 13/779544  
DATED : March 14, 2017  
INVENTOR(S) : Long et al.

Page 1 of 1

It is certified that error appears in the above-identified patent and that said Letters Patent is hereby corrected as shown below:

In the Claims

In Column 11, Line 54, Claim 1, following "testing the first semiconductor component" insert --in the second set--.

Signed and Sealed this
Thirty-first Day of July, 2018

Andrei Iancu
*Director of the United States Patent and Trademark Office*